(12) United States Patent
Takada et al.

(10) Patent No.: US 6,650,956 B2
(45) Date of Patent: Nov. 18, 2003

(54) WIRING HARNESS CHECKING METHOD

(75) Inventors: Kazuhiko Takada, Shizuoka (JP);
Yutaka Matsuoka, Shizuoka (JP);
Katsuhiro Suzuki, Shizuoka (JP);
Hidehiko Yabuuchi, Aichi (JP);
Toshiyuki Ueki, Aichi (JP); Wataru Tanizawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 291 days.

(21) Appl. No.: 09/793,678

(22) Filed: Feb. 27, 2001

(65) Prior Publication Data

US 2001/0025206 A1 Sep. 27, 2001

(30) Foreign Application Priority Data

Mar. 14, 2000 (JP) .......................... 2000-070415

(51) Int. Cl.[7] .............................................. G06F 19/00
(52) U.S. Cl. ..................... 700/110; 700/98; 700/108; 700/109; 439/355; 439/733.1; 324/500; 324/503; 324/538
(58) Field of Search ................................ 700/150, 110; 439/730; 174/729; 324/500

(56) References Cited

U.S. PATENT DOCUMENTS 4,620,282 A * 10/1986 Shelley ........................ 716/4

5,374,778 A * 12/1994 Hashimoto et al. ............ 174/36
5,707,242 A * 1/1998 Mitra et al. ............... 439/733.1
5,749,752 A * 5/1998 Kashiyama et al. ....... 439/733.1
6,230,386 B1 * 5/2001 Hasegawa .................. 29/564.4

FOREIGN PATENT DOCUMENTS

| JP | 9-115639 | 5/1997 |
| JP | 10-112229 | 4/1998 |
| JP | 10-154568 | 6/1998 |

* cited by examiner

Primary Examiner—Leo Picard
Assistant Examiner—Carlos R. Ortiz
(74) Attorney, Agent, or Firm—Armstrong, Westerman & Hattori, LLP

(57) ABSTRACT

A checking method is described for a wiring harness having first sub-harnesses and second sub-harnesses in which the first sub-harness has a first press-fit terminal joined to each end of a first electrical cable, and the first sub-harness has a first isolator holding the first press-fit terminal and the second sub-harness has a second press-fit terminal, a crimp terminal, a connector housing for accommodating the crimp terminal, a second isolator supporting the second press-fit terminal and wherein a second electrical cable connects the second press fit terminal and the crimp terminal at opposite ends. The checking method, which is effective upon layering of the first and second isolators includes the conduct of decision steps for determining acceptance or rejection of the individual sub-harnesses after assembly thereof and a final decision step for determining acceptance or rejection of the completed wiring harness layering following of the isolators of the first and second sub-harness.

5 Claims, 19 Drawing Sheets

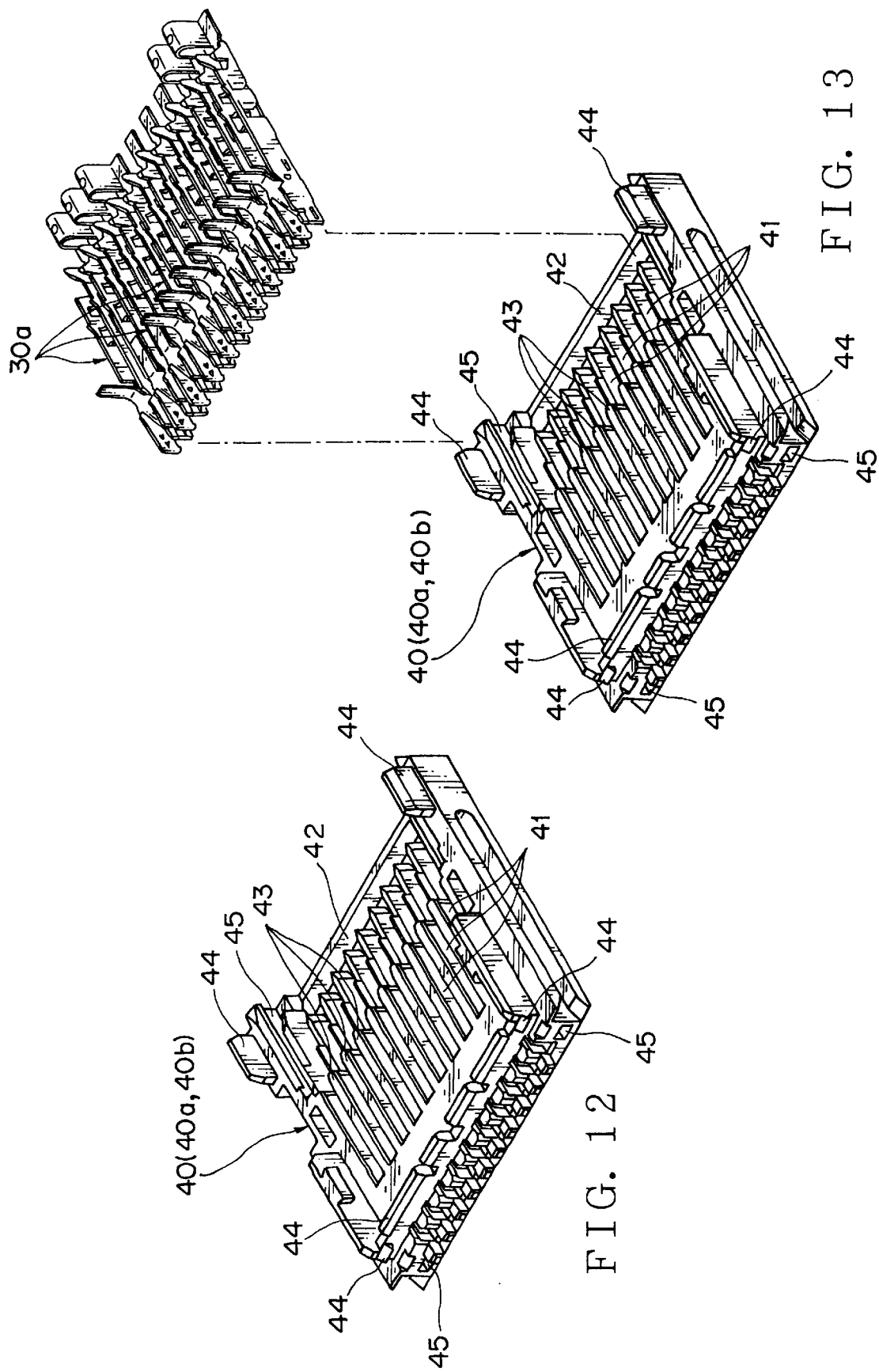

WIRING HARNESS CHECKING METHOD

BACKGROUND OF THE INVENTION

1. Field of the Invention

The present invention relates to a checking method of a wiring harness arranged in a mobile unit such as a motor vehicle.

2. Related Art

A motor vehicle has a wiring harness for supplying power to electrical appliances such as various lamps and motors from a battery. A conventional wiring harness includes a plurality of electrical cables, a plurality of terminals each fitted to an end of each electrical cable, connector housings accommodating the terminals, etc.

An ordinary or high grade car has an increasing number of on-vehicle electronics components, which requires hundreds to thousands of electrical cables. Thus, a wiring harness for such a car tends to have an increasing number of electrical cables.

A plurality of sub-harnesses are pre-assembled and each wiring harness is obtained by assembling the sub-harnesses. The sub-harness has a plurality of electrical cables, terminals each connected to an end of the electrical cable, and a connector housing accommodating some of the terminals. The sub-harness may have terminals which are not received in the connector housing to be an unprotected state.

An electrical continuity check of the wiring harness will be carried out after combination of the sub-harnesses when the sub-harnesses has the unprotected terminals, due to the circuit incompleteness of the sub-harnesses. In the electrical continuity check of the wiring harness, the terminals each are checked in electrical continuity with the other terminals to determine acceptance or rejection of the wiring harness. Such checking methods of the wiring harness have been carried out through the following sequential steps.

Each terminal of the wiring harness is selected sequentially to supply a voltage, while the other terminals of the wiring harness are checked in voltage thereof. Thereby, the electrical continuity relationship of the terminals can be known.

The obtained electrical continuity relationship of the terminals is compared with a pre-designed electrical continuity pattern of the wiring harness. Thereby, acceptance or rejection of the wiring harness has been determined, and an incorrect continuity point of the wiring harness could be found, if present.

The aforementioned conventional checking method of the wiring harness applies a voltage to each terminal sequentially to measure the other terminals in voltage. Thus, the voltage application is repeated for the total number of the terminals, so that it disadvantageously takes a long time to check the wiring harness since the electrical cables and terminals are increasing in number.

For example, it takes a time T that a voltage is applied to one of the terminals of the wiring harness to measure the other terminals in voltage. When the wiring harness has 3,000 terminals, it requires a time of T×3,000 for checking electrical continuity of the terminals.

Moreover, it is necessary to transfer the wiring harness from its production line to a checking apparatus. Thereby, a long time is required to complete the wiring harness, causing a decreased productivity of the wiring harness.

In addition, it is difficult to know which assembling step of the wiring harness has been incorrect, since the electrical continuity of the terminals is checked after the completion of the wiring harness.

Furthermore, when an incorrect continuity point of a wiring harness is recognized, another wiring harness or an intermediate product which includes the same incorrectness would have been assembled. This tends to cause a further decreased productivity of the wiring harnesses.

SUMMARY OF THE INVENTION

Therefore, an object of the invention is to provide a checking method of a wiring harness, in which an appropriate productivity of the wiring harness is achieved.

For achieving the object, a checking method according to the present invention is provided for determining acceptance or rejection of a wiring harness having a plurality of first sub-harnesses and a plurality of second sub-harnesses. The first sub-harnesses has a plurality of electrical cables, a plurality of first press-fit terminals, and a first isolator. The first press-fit terminal is joined to each end of the first electrical cable. The first isolator holds the first press-fit terminals positioned at one end of the first sub-harness. The second sub-harness has a plurality of second electrical cables, a plurality of second press-fit terminals, a plurality of crimp terminals, a connector housing for accommodating the crimp terminals, and a second isolator supporting the second press-fit terminals. The second press-fit terminal is connected to one end of the second electrical cable. The crimp terminal is connected to the other end of the second electrical cable. When any of the first and second isolators are layered, the press-fit terminals held by different ones of the isolators can be connected to one another. The method includes:

a first decision step for determining acceptance or rejection of the first sub-harness after assembling of the first sub-harness, a second decision step for determining acceptance or rejection of the second sub-harness after assembling of the second sub-harness, and a third decision step for determining acceptance or rejection of the wiring harness after layering the isolators of the first and second sub-harnesses to complete the wiring harness.

a first decision step for determining acceptance or rejection of the first sub-harness after assembling of the first sub-harness, a second decision step for determining acceptance or rejection of the second sub-harness after assembling of the second sub-harness, and a third decision step for determining acceptance or rejection of the wiring harness after layering the isolators of the first and second sub-harnesses to complete the wiring harness.

Preferably, the third decision step inspects electrical continuity between the press-fit terminals of the layered isolators.

Preferably, the first decision step inspects electrical continuity between the press-fit terminals constituting the first sub-harness.

Preferably, the second decision step inspects electrical continuity between the terminals constituting the second sub-harness.

Further preferably, the first press-fit terminal has a press-fit portion for press-fitting the first electrical cable on the terminal and a crimping piece for crimping the first electrical cable to the terminal, and a press-fitting machine press-fits the first electrical cable to the press-fit portion of the first press-fit terminal and the press-fitting machine crimps the first electrical cable to the crimping piece. The press-fitting machine has a plurality of press-fitting means with an electrical conductivity. The first decision step inspects electrical continuity between the press fit means each of which contacting the crimping piece when the first electrical cable is press-fitted to the first press-fit terminal.

According to the main aspect of the invention, the first decision step determines acceptance or rejection of the first sub-harness, and the second decision step determines acceptance or rejection of the second sub-harness. Thus, the sub-harnesses are checked one after another just after the assembling thereof, eliminating the production of a plurality of sub-harnesses having the same incorrectness of a short circuit or an open circuit.

The first or second decision step determines acceptance or rejection of the first or second sub-harness. Such incorrectness can be quickly found to be repaired, improving a productivity of the wiring harness.

Moreover, the sub-wiring harnesses are checked one after another so that the production of a type of sub-wiring harnesses, in which an incorrectness have been found, is stopped. This prevents an otherwise decreased productivity of the wiring harness.

According to one of the preferable aspects of the present invention, after completion of the wiring harness, it is only required that the predetermined press-fit terminals are checked in electrical continuity therebetween. This decreases a total checking time of the wiring harness.

The electrical continuity condition between the press-fit terminals mounted on the different isolators is checked, allowing a decreased check time of the wiring harness. Thus, in addition, the wiring harness can be checked when it is in the production line for combining the sub-harnesses. Accordingly, the wiring harness requires no transfer from the wiring harness assembling line to another specified check apparatus, allowing an improved productivity of the wiring harness.

According to another of the preferable aspects of the invention, during an assembling step of the first sub-harness for fitting the first electrical cable to the first press-fit terminal, the electrical continuity between the press-fit means contacting the press-fit terminals is checked. This enables to surely find an incorrect closed or open circuit of the first sub-harness.

The electrical continuity between the press-fit terminals constituting the first sub-harness is checked, allowing to surely find incorrectness of a short circuit or an open circuit of sub-harness. Such incorrectness can be quickly found, improving a productivity of the wiring harness. Furthermore, the electrical continuity check of the first electrical cable is carried out during a fitting work of the first press-fit terminal, allowing a further improved workability.

BRIEF DESCRIPTION OF THE DRAWINGS

FIG. 12 is a perspective view showing a terminal fitting housing of the wiring harness of FIG. 8;

FIG. 13 is a perspective view showing the terminal fitting housing of FIG. 12 and press-fit terminals used in a joint connector, which are just going to be inserted into the housing;

DETAILED DESCRIPTION OF THE PREFERRED EMBODIMENT

Referring to FIGS. 8 to 25, a wiring harness 1 of which acceptance or rejection is determined according to a checking method of an embodiment will be discussed hereinafter.

Figure 8:
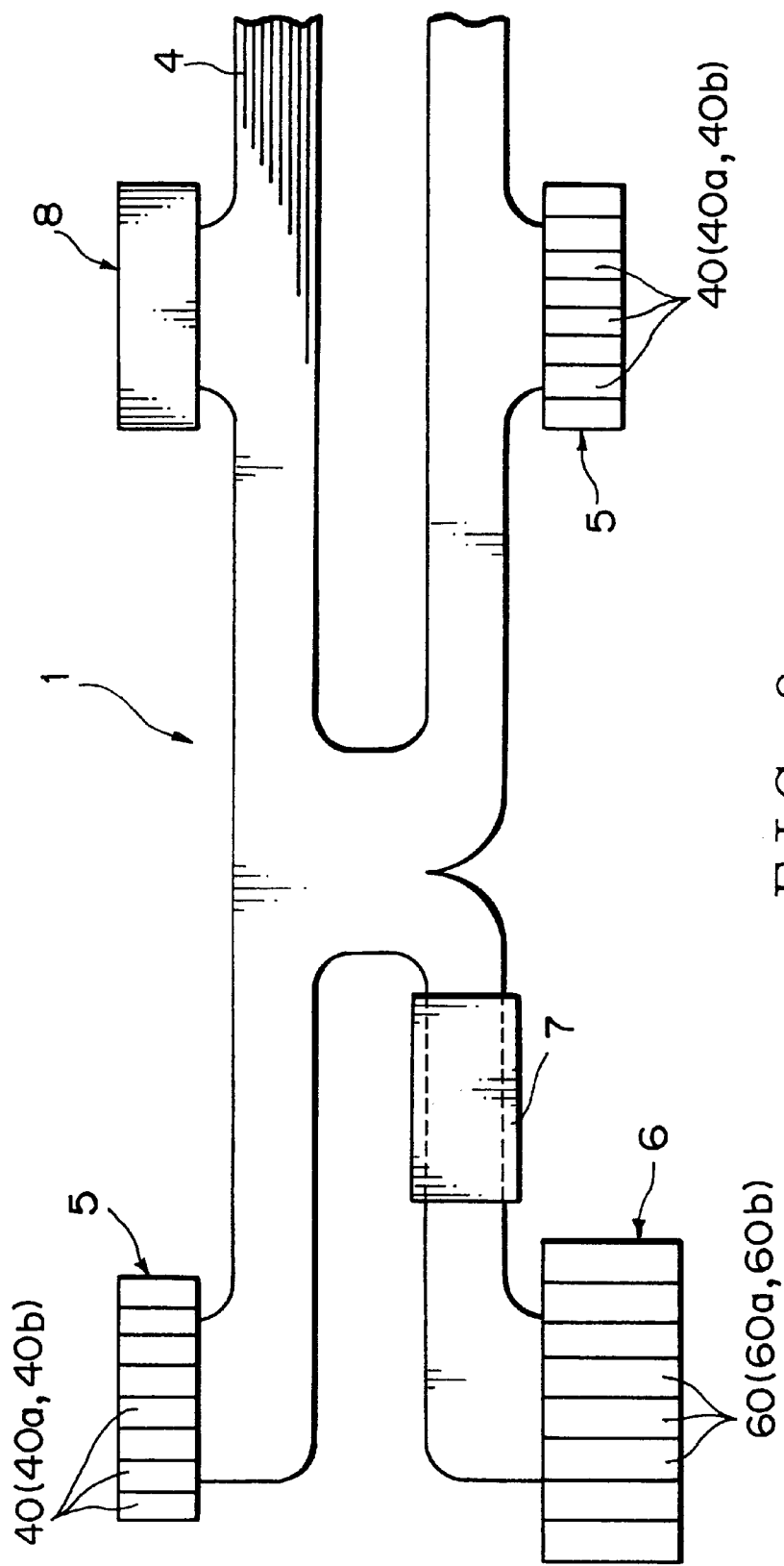
FIG. 8 is a view illustrating a concept of a wiring harness assembled by a wiring harness production apparatus according to the present invention.

The wiring harness 1 illustrated in FIG. 8 is arranged in a motor vehicle to supply a power from a power source like a battery to on-vehicle electric appliances such as various lamps and various motors.

As illustrated in FIG 8, the wiring harness 1 has a lot of electrical cables 4, connectors 5 an electrical distribution block 6, a connector 8, and other fittings like a protector 7. Each electrical cable 4 is an insulated one having a conductive wire core and an insulating sheath that covers the core. A plurality of the protectors 7 are provided at appropriate positions to adequately secure the electrical cables 4.

Figure 21:
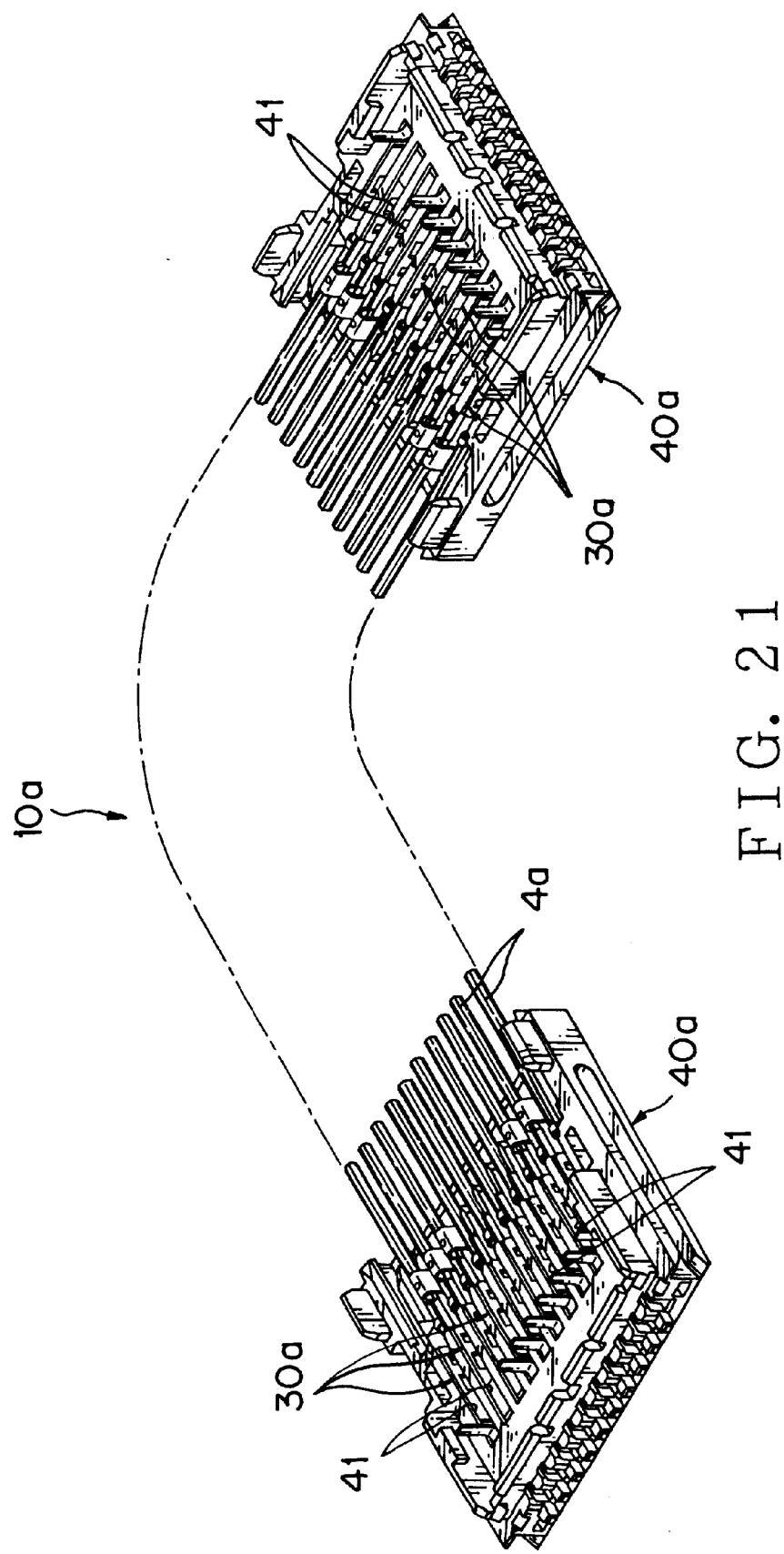
FIG. 21 is a perspective view showing an example of a sub-harness of the wiring harness shown in FIG. 8, and the sub-harness has press-fit terminals at each end thereof.
Figure 22:
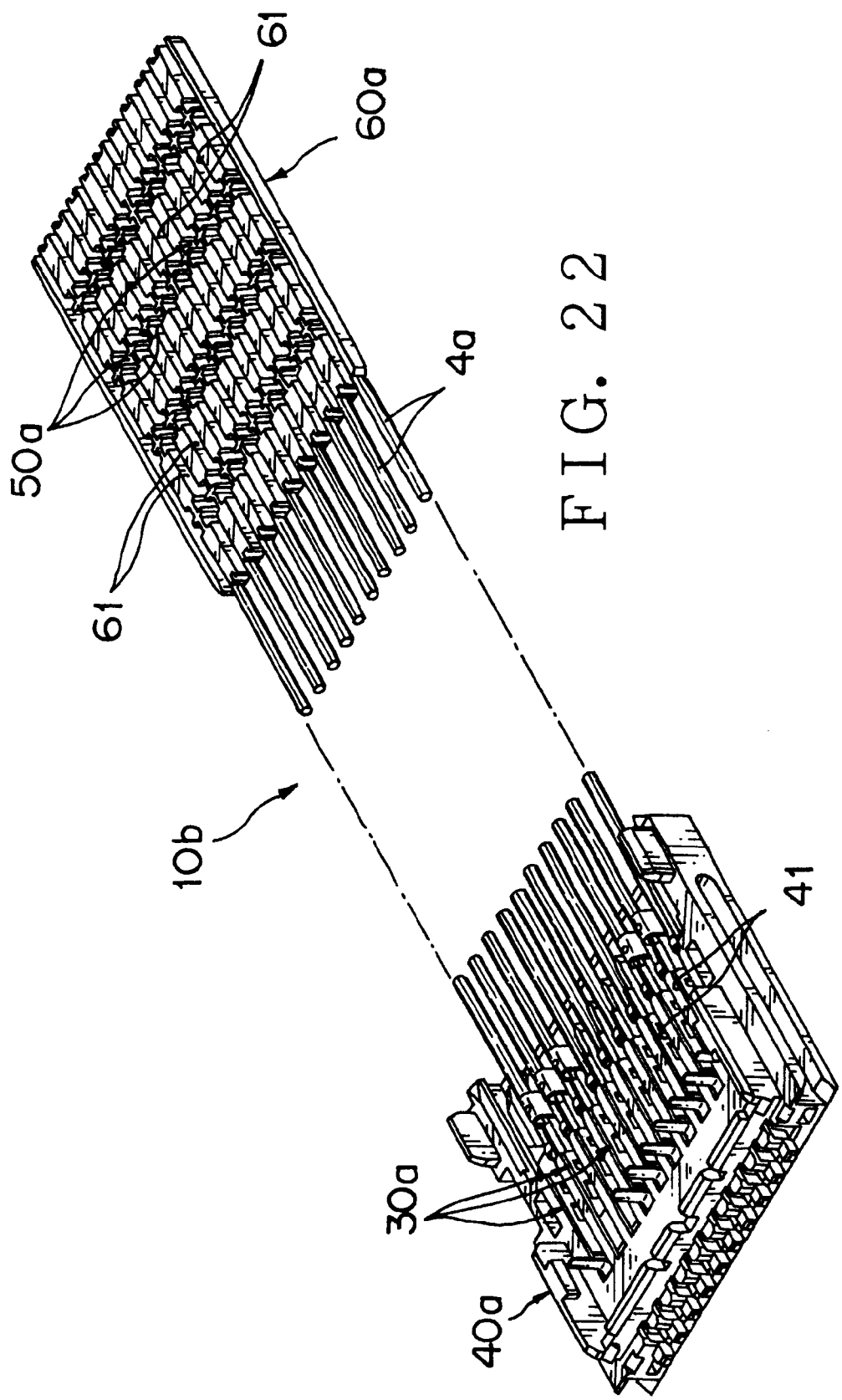
FIG. 22 is a perspective view showing another example of a sub-harness of the wiring harness shown in FIG. 8, and the sub-harness has press-fit terminals at each end thereof.
Figure 23:
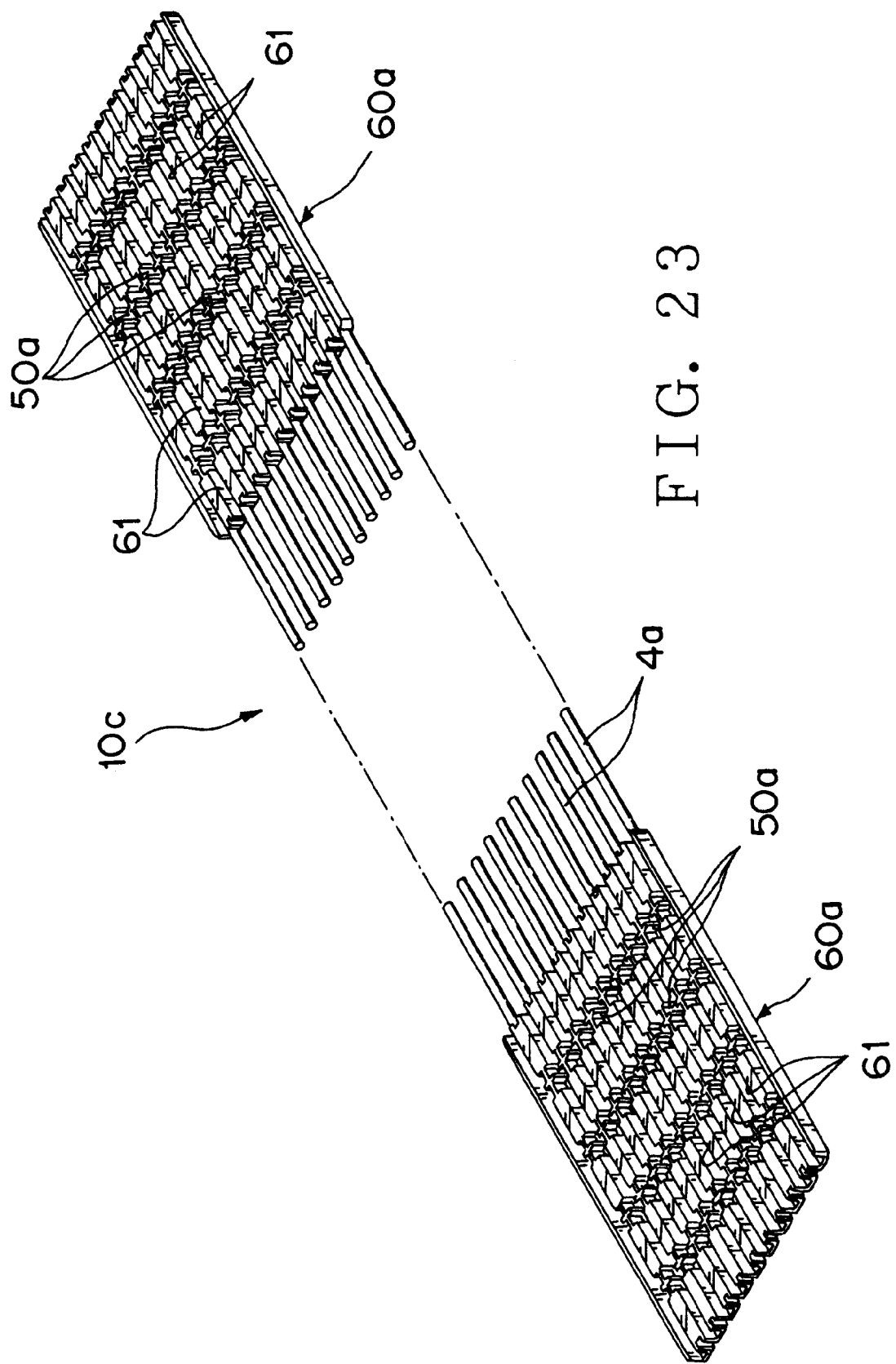
FIG. 23 is a perspective view showing further another example of a sub-harness of the wiring harness shown in FIG. 8, and the sub-harness has press-fit terminals at each end thereof.

The wiring harness 1 has at least one type of sub-harnesses freely selected from sub-harnesses 10a, 10b, and 10c each having a press-fit terminal at each end as illustrated in FIGS. 21 to 23. The wiring harnesses may have more than one of the sub-harnesses 10a, 10b, and 10c. That is, the wiring harness 1 may have any of the sub-harnesses 10a, 10b, and 10c.

Figure 24:
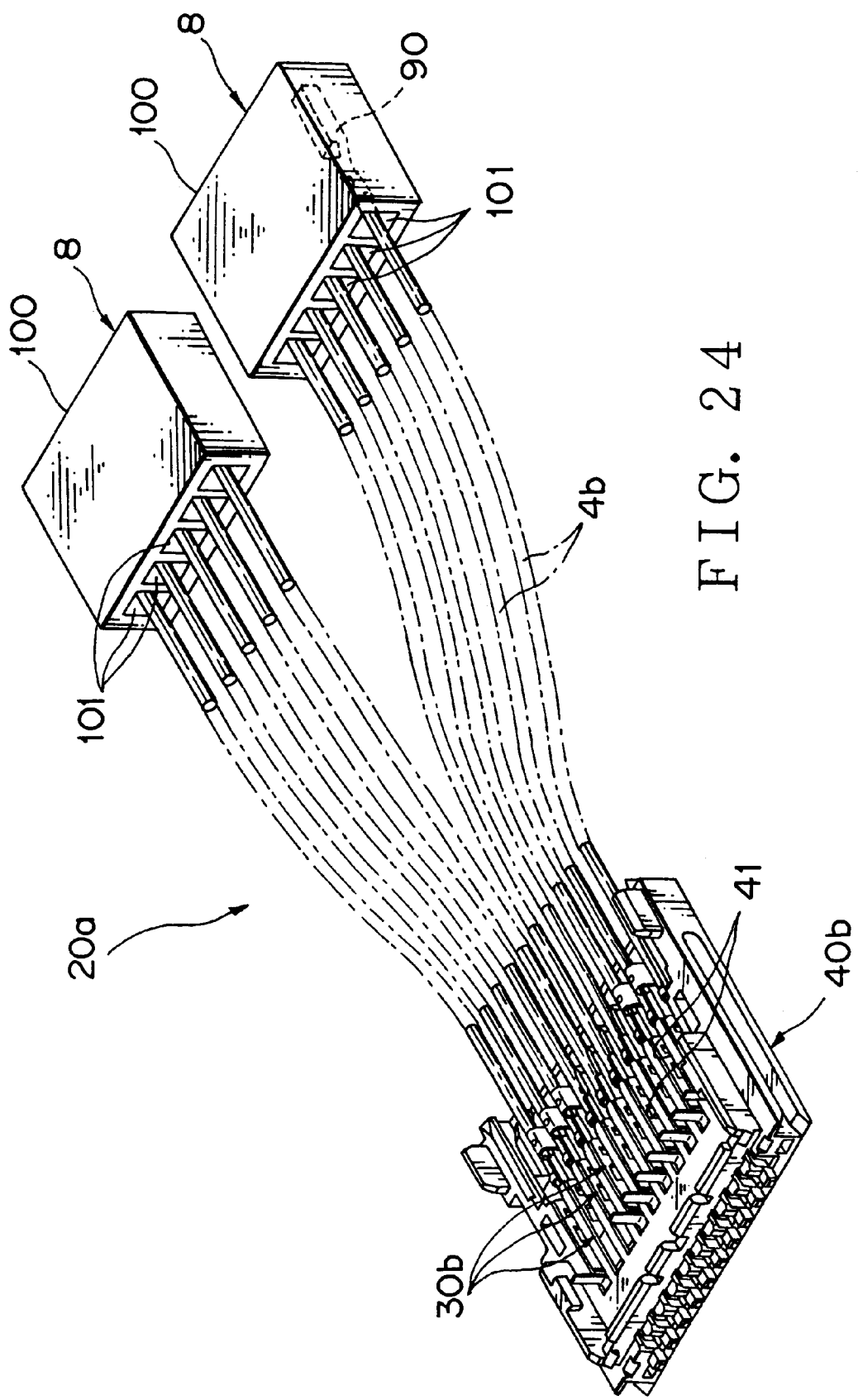
FIG. 24 is a perspective view showing an example of a sub-harness of the wiring harness shown in FIG. 8, and the sub-harness has press-fit terminals at one end and crimp terminals at the other end.
Figure 25:
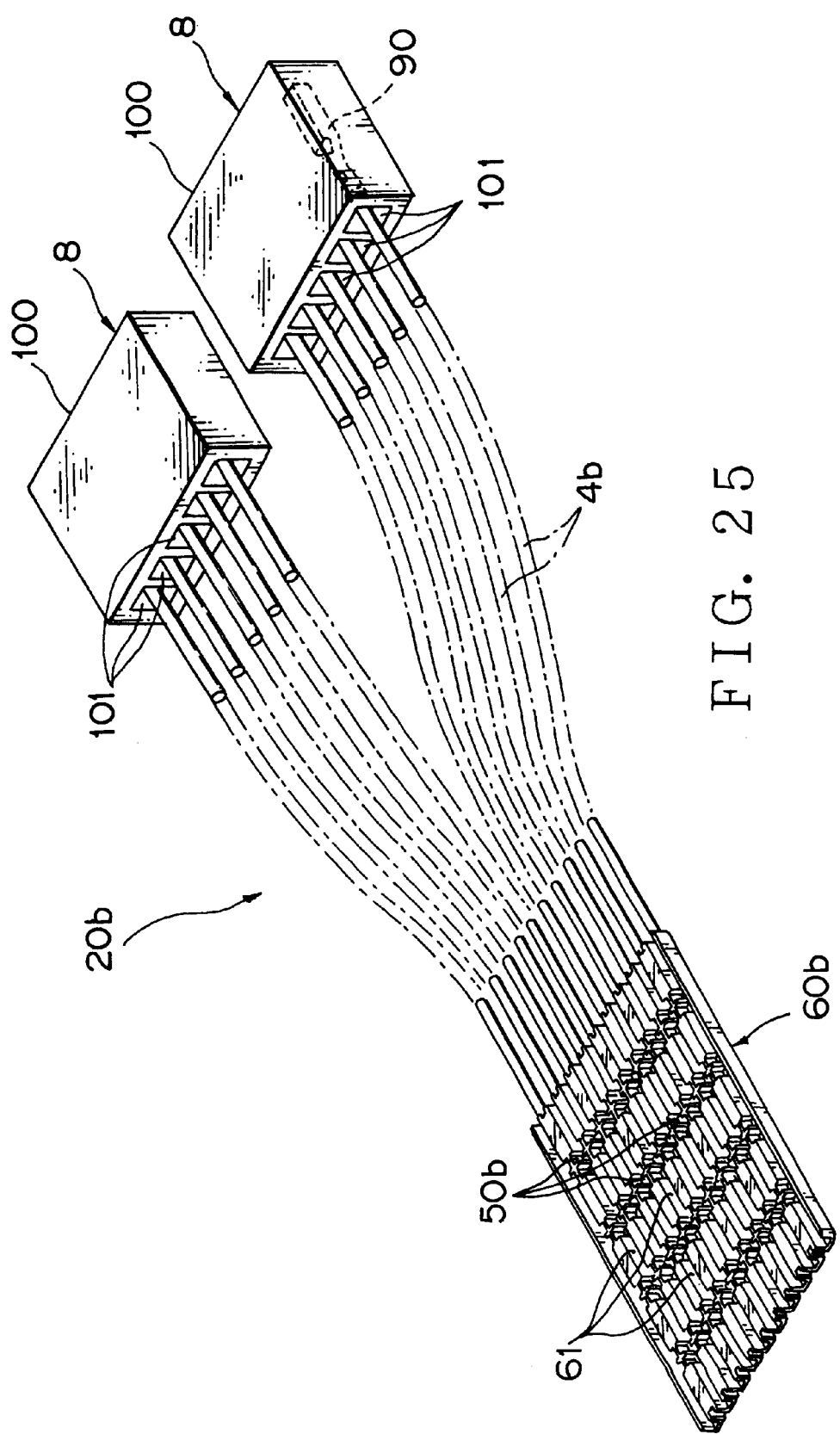
FIG. 25 is a perspective view showing another example of a sub-harness of the wiring harness shown in FIG. 8, and the sub-harness has press-fit terminals at one end and crimp terminals at the other end.

Alternatively, the wiring harness 1 may have one or more of sub-harnesses 20a and 20b each having a press-fit terminal at one end and a crimp terminal at the other end as illustrated in FIGS. 24 and 25. Alternatively, the wiring harness 1 may have one or more of the sub-harnesses 10a, 10b, and 10c and one or more of the sub-harnesses 20a and 20b.

The wiring harness 1 is generally completed by incorporating the sub-harnesses 10a, 10b, and 10c with the sub-harnesses 20a and 20b as described later. Note that the sub-harness 10a, 10b, or 10c corresponds to the first sub-harness described in the summary of the invention, and the sub-harness 20a or 20b corresponds to the second sub-harness.

Figure 9:
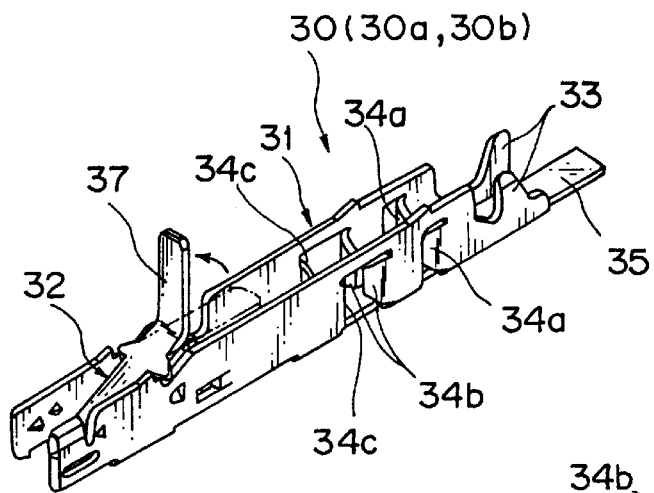
FIG. 9 is a perspective view of a press-fit terminal used in a joint connector of the wiring harness of the embodiment.
Figure 10:
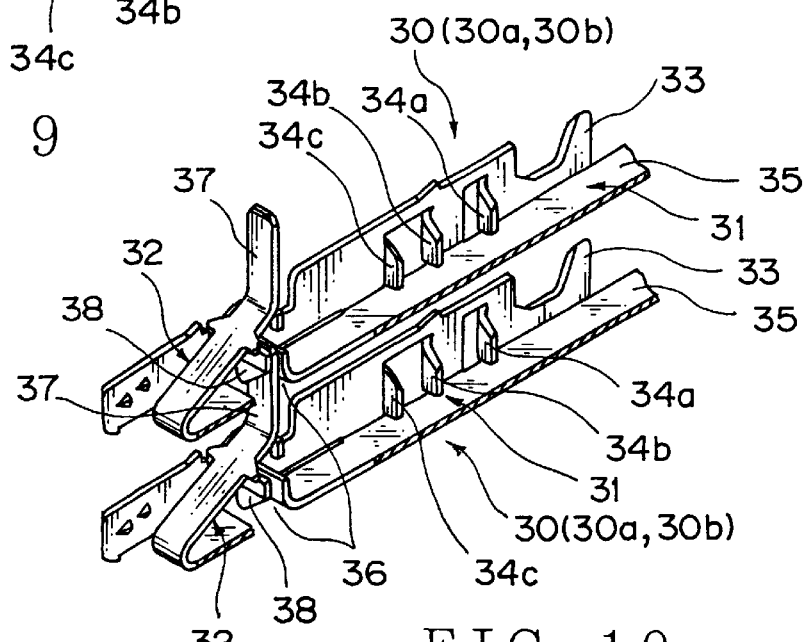
FIG. 10 is a perspective view showing some of the press-fit terminals of FIG. 9, the terminals being layered to electrically connect to each other.
Figure 11:
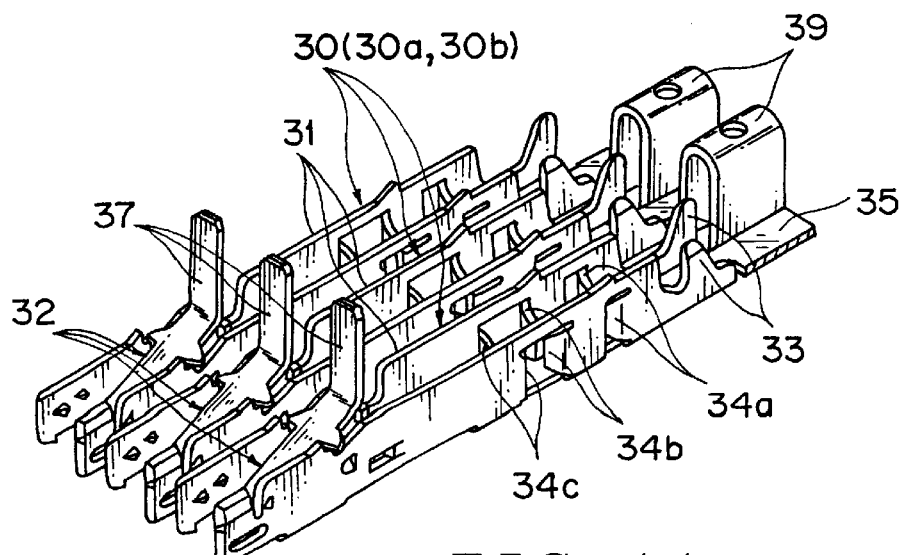
FIG. 11 is a perspective view showing some of the press-fit terminals of FIG. 2, the terminals being disposed in parallel to electrically connect to each other.

The sub-harness 10a illustrated in FIG. 21 has a parallel row of electrical cables 4a, press-fit terminals 30a for a junction box, and terminal fitting housings 40a. The press-fit terminal 30a is illustrated in FIGS. 9 to 11, and the terminal fitting housing 40a that is an isolator is illustrated in FIGS. 12 to 15.

Figure 19:
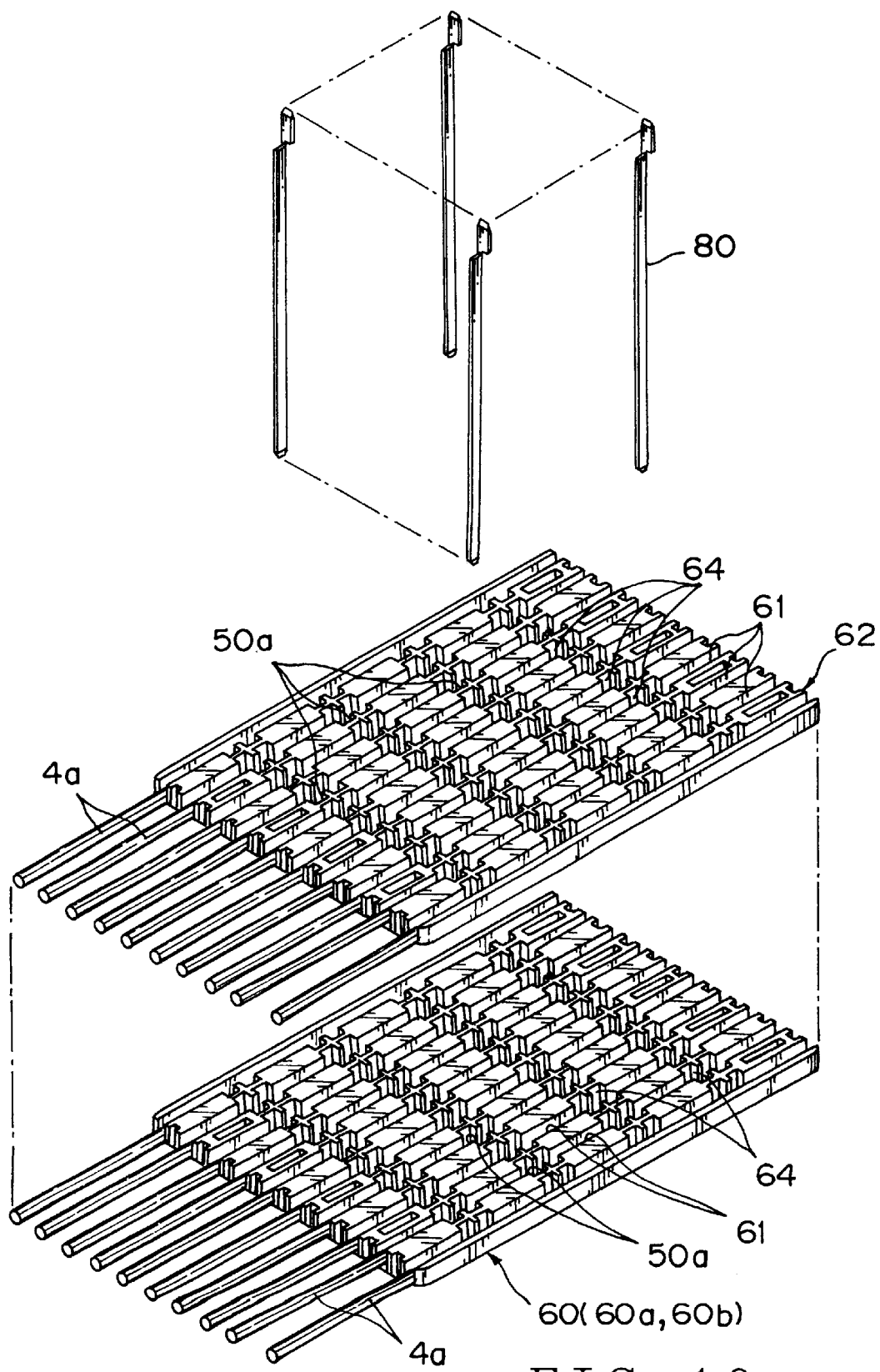
FIG. 19 is a perspective view showing the terminal fitting plates of FIG. 8 which are layered with a space therebetween.
Figure 20:
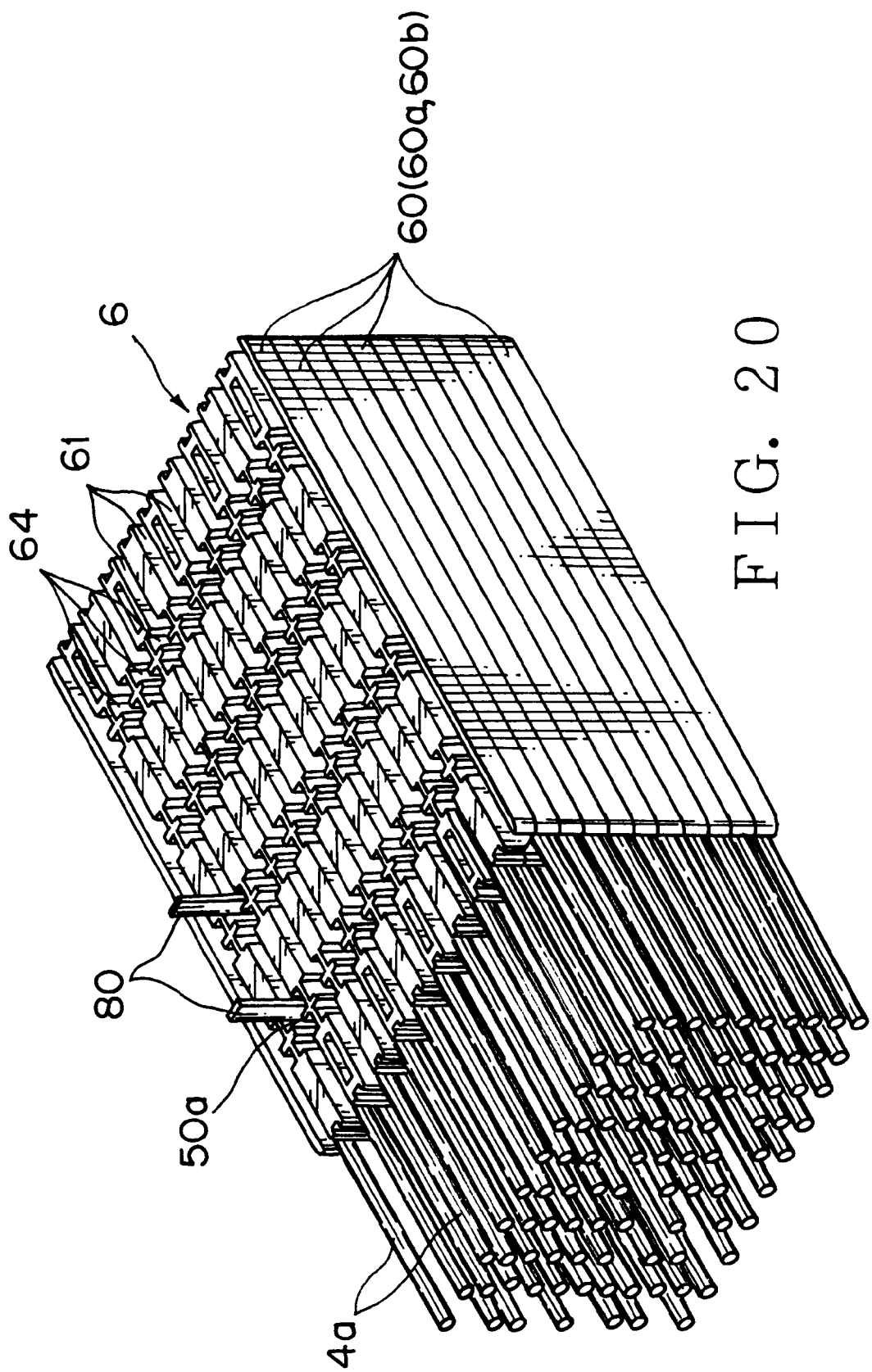
FIG. 20 is a perspective view showing a distribution block defined by securing the terminal fitting plates of FIG. 8 to one another.

Alternatively, the wiring harness 1 may have one or more of the sub-harnesses 20a and 20b each having a press-fit terminal at one end and a crimp terminal at the other end as illustrated in FIGS. 19 and 20. Alternatively, the wiring harness 1 may have one or more of the sub-harnesses 10a, 10b, and 10c and one or more of the sub-harnesses 20a and 20b.

The wiring harness 1 is generally completed by incorporating the sub-harnesses 10a, 10b, and 10c with the sub-harnesses 20a and 20b as described later. Note that the sub-harness 10a, 10b, or 10c corresponds to the first sub-harness described in the summary of the invention, and the sub-harness 20a or 20b corresponds to the second sub-harness.

Figure 2:
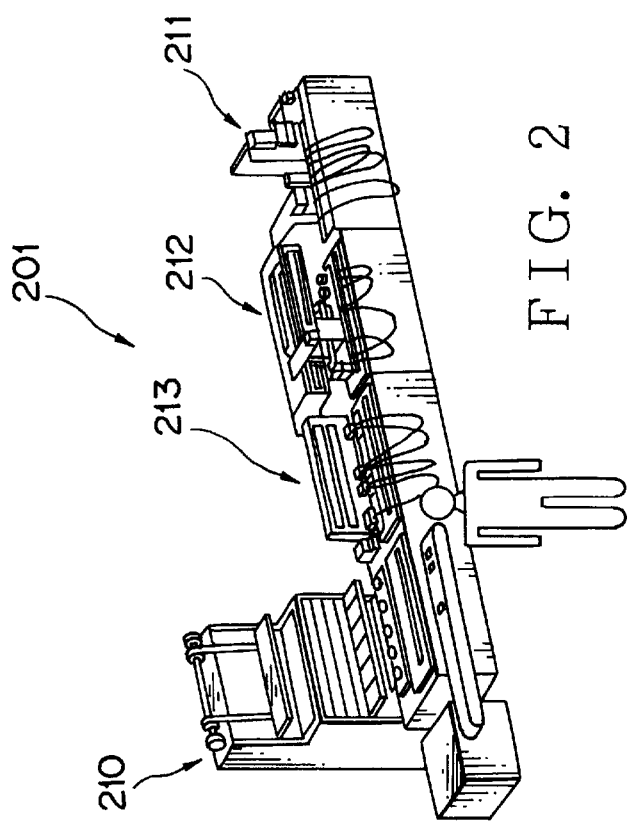
FIG. 2 is a perspective view showing a sub-harness assembling line including production apparatuses for a sub-harness of the wiring harness, which is related to the checking method, and the sub-harness has a press-fit terminal at each end thereof.
Figure 3:
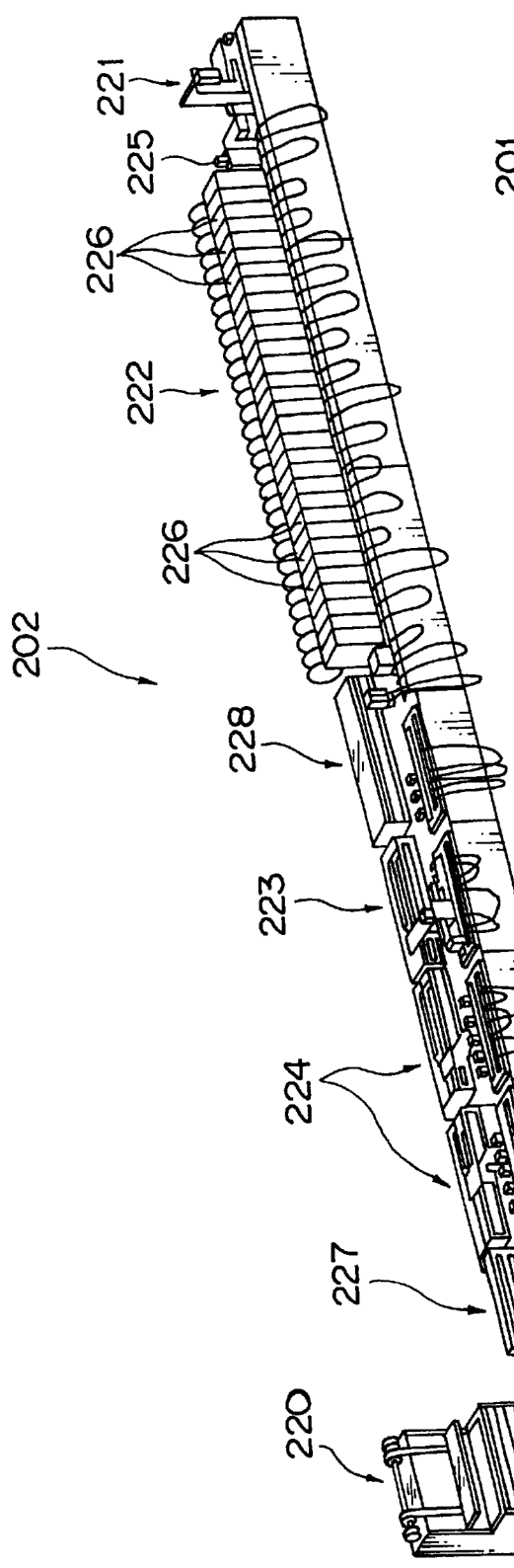
FIG. 3 is a perspective view showing a sub-harness assembling line including production apparatuses for a sub-harness of the wiring harness, and the sub-harness has a press-fit terminal at one end and a crimp terminal at the other end thereof.
Figure 4:
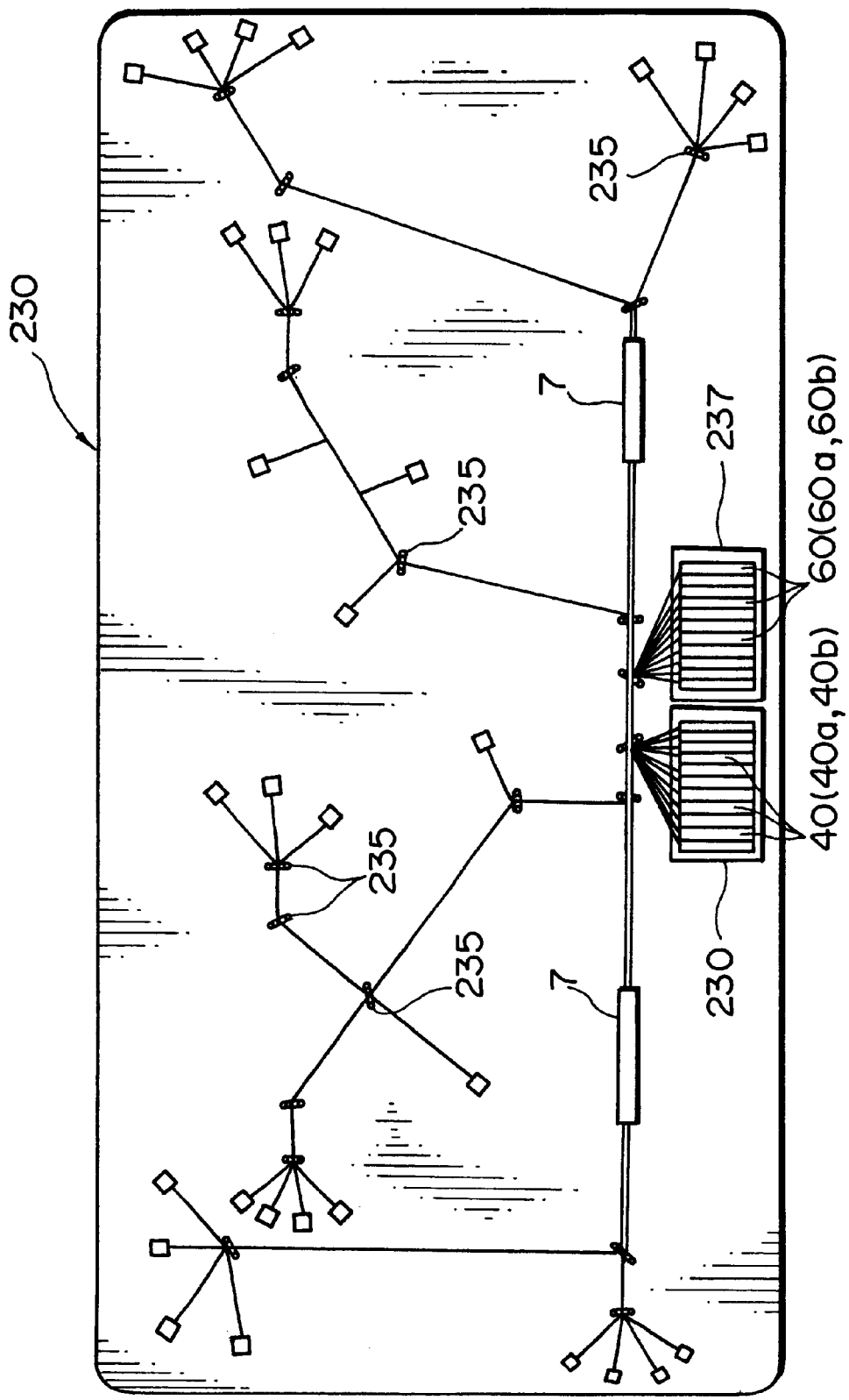
FIG. 4 is a plan view showing a wiring board used in a wiring harness assembling line for producing the wiring harness.
Figure 16:
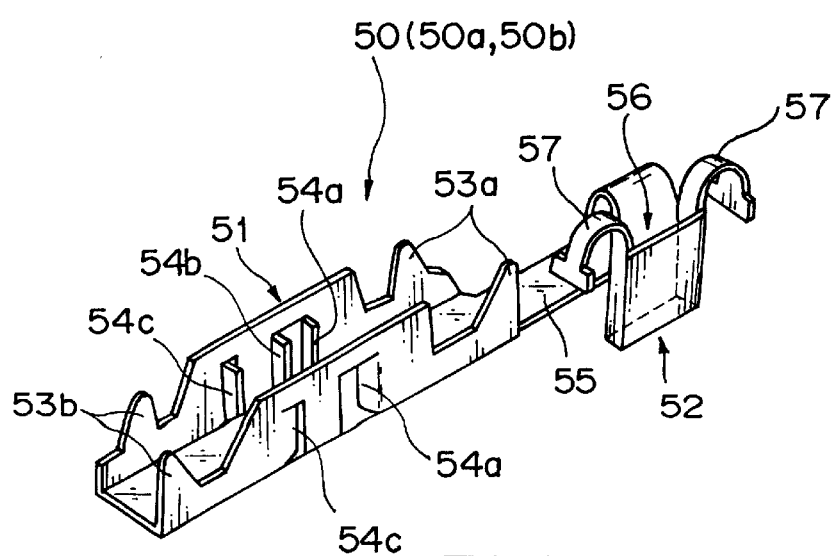
FIG. 16 is a perspective view showing a press-fit terminal used in a junction-box of a wiring harness of FIG. 8.

The sub-harness 10a illustrated in FIG. 16 has a parallel row of electrical cables 4a, press-fit terminals 30a for a junction box, and terminal fitting housings 40a. The press-fit terminal 30a is illustrated in FIGS. 2 to 4, and the terminal fitting housing 40a that is an isolator is illustrated in FIGS. 5 to 10.

The press-fit terminal 30a is fitted to each end of the electrical cable 4a. The press-fit terminal 30a is received in a terminal accommodation chamber 41, which will be discussed later, of the terminal fitting housing 40a.

Figure 18:
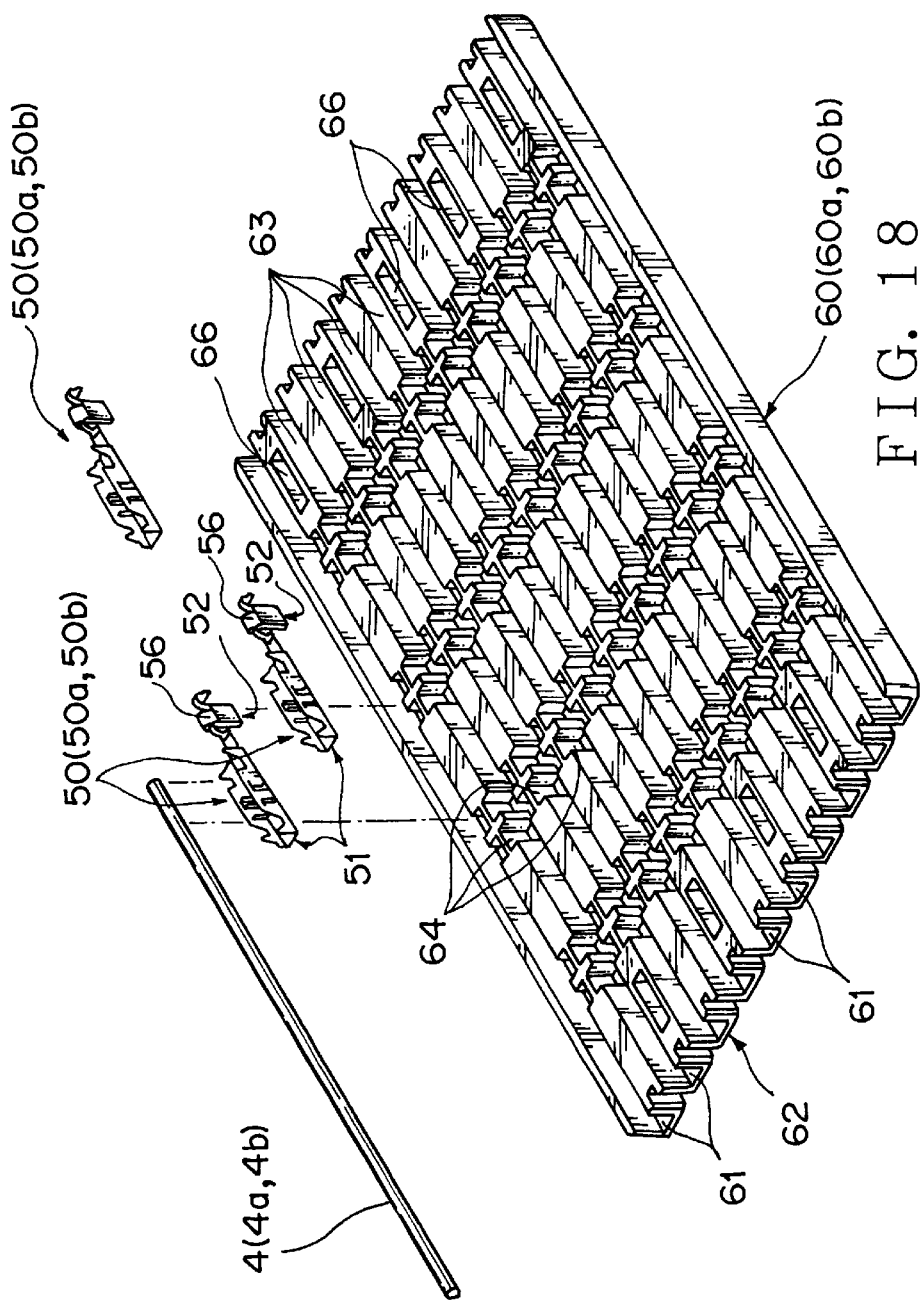
FIG. 18 is a perspective view showing a terminal fitting plate of the wiring harness embodying the present invention and showing in-junction-box disposed press-fit terminals and electrical cables received in the terminal fitting plate.
Figure 17:
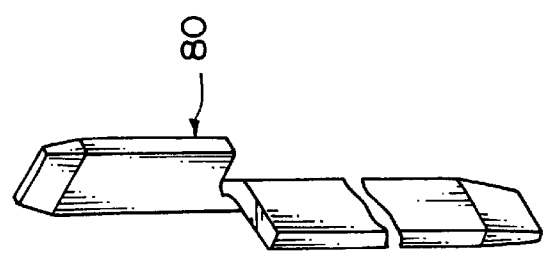
FIG. 17 is a perspective view showing a joint bar of the wiring harness of FIG. 8.

The sub-harness 10b illustrated in FIG. 22 has a parallel row of electrical cables 4a, press-fit terminals 30a for a joint connector, a press-fit terminal housing 40a, press-fit terminals 50a for a junction box, and terminal fitting plates 60a. The press-fit terminal 30a is also illustrated in FIG. 16, and the terminal fitting plate 60 is also illustrated in FIGS. 18 to 20.

The in-junction-box press-fit terminals 30a each are fitted to an end of the electrical cables 4a. Each press-fit terminal 30a is received in the terminal accommodation chamber 41 of the terminal fitting housing 40a. The in-junction-box press-fit terminal 50a is fitted to the other end of the electrical cables 4a. The press-fit terminals 50a each are received in an electrical cable accommodation chamber 61, which will be discussed later, of the terminal fitting plate 60a.

The sub-harness 10c illustrated in FIG. 23 has a parallel row of electrical cables 4a, press-fit terminals 50a for a junction box, and terminal fitting plates 60a. The press-fit terminal 50a is fitted to each end of the electrical cables 4a. The press-fit terminal 50a is received in an electrical cable accommodation chamber 61 of the terminal fitting plate 60a.

In the examples illustrated in FIGS. 21 to 23, the electrical cables 4a each are fitted to the terminal fitting housing 40a or to the terminal fitting plate 60a at each end thereof. However, the sub-harness 10a, 10b, or 10c may have a plurality of the terminal fitting housings 40a or the terminal fitting plates 60a at each end side of the electrical cables 4a.

The electrical cable 4a of the sub-harnesses 10a, 10b, and 10c corresponds to the first electrical cable described in the summary of the invention. The press-fit terminal 30a and the press-fit terminal 50a of the sub-harnesses 10a, 10b, and 10c correspond to the first press-fit terminals described in the invention summary. The terminal fitting housing 40a and the terminal fitting plate 60a of the sub-harnesses 10a, 10b, and 10c correspond to the first isolators described in the invention summary.

The sub-harness 20a illustrated in FIG. 24 has a parallel row of electrical cables 4b, press-fit terminals 30b for a junction box, terminal fitting housings 40b, crimp terminals 90, and connector housings 100. The terminal fitting housing 40b functions as an isolator.

Each press-fit terminal 30b is fitted to an end of each electrical cable 4b. The press-fit terminal 30b is received in a terminal accommodation chamber 41 of the terminal fitting housing 40b. The crimp terminal 90 is defined by bending a conductor plate. The crimp terminal 90 is crimped to the other end of the electrical cable 4b.

The connector housing 100 is made of an insulating synthetic resin material and has a box shape. The connector housing 100 has a plurality of terminal accommodation chambers 101 receiving the crimp terminals 90. The terminal accommodation chamber 101 of the connector housing 100 receives the crimp terminal 90 crimped to the other end of the electrical cable 4b. The connector housing 100 and the crimp terminals 90 received in the terminal accommodation chambers 101 constitute the connector 8.

The sub-harness 20b illustrated in FIG. 25 has a parallel row of electrical cables 4b, press-fit terminals 50b for a junction box, a terminal fitting plate 60*b* that functions as an isolator, crimp terminals 90, and a connector housing 100.

Each press-fit terminal 50*b* is fitted to an end of each electrical cable 4*b*. The press-fit terminal 50*b* is received in an electrical cable accommodation chamber 61 of the terminal fitting plate 60*b*. The crimp terminal 90 and the connector housing 100, which are illustrated in FIG. 20, are the same as those of the sub-harness 20*a*. Thus, the same reference numerals are provided for them not to be discussed again.

In the examples illustrated in FIG. 24 and FIG. 25, the electrical cables 4*b* are fitted to the terminal fitting housing 40*a* or the terminal fitting plate 60*a* at one end side thereof, while the electrical cables 4*b* are fitted to two separate connectors 8 at the other end side thereof.

Alternatively, the sub-harness 20*a* or 20*b* of the wiring harness 1 may have one or more than three connectors 8 at the other end side of the electrical cables 4*b*.

The electrical cable 4*b* of the sub-harnesses 20*a* and 20*b* corresponds to the second electrical cable described in the invention summary. The press-fit terminal 30*b* and the press-fit terminal 50*b* for a junction-box of the sub-harness 20*a* and 20*b* correspond to the second press-fit terminals described in the invention summary. The terminal fitting housing 40*b* and the terminal fitting plate 60*b* of the sub-harness 20*a* and 20*b* each correspond to the second isolator described in the invention summary.

Since press-fit terminals 30*a* and 30*b* have the same configuration as each other, only the press-fit terminal 30*a* will be representatively discussed. The press-fit terminal 30*a* is defined by bending a conductor plate. As illustrated in FIGS. 2 and 3, the press-fit terminal 30*a* has a flat bottom wall 35 on which an electrical cable 4*a* is disposed, an electrical cable connection portion 31, and an electrical contact piece 32.

The electrical cable connection portion 31 has a pair of opposing crimping pieces 33 and three pairs of press fitting blades 34*a*, 34*b*, and 34*c*. The crimping pieces 33 and the press fitting blades 34*a*, 34*b*, and 34*c* are vertically extending relative to the bottom wall 35.

The crimping pieces 33 are bent to hold the electrical cable 4*a* disposed on the bottom wall 35. The press fitting blades 34*a*, 34*b*, and 34*c* receive the electrical cable 4*a* which is inserted between each pair of the blades. Thereby, the blades cut into the sheath of the electrical cable 4*a* to contact the wire core to electrically connect to the electrical cable 4*a*. That is, the press-fitting of the blades for the electrical cable 4*a* is completed.

The electrical contact piece 32 has an opening 36 (see FIG. 10) provided in the bottom wall 35 and has a contact piece 37 raised from the bottom wall 35 and serving as a connection means. The contact piece 37 is changeable from a rising position to a parallel position relative to the bottom wall 35 by a bending work. The parallel position is illustrated by a chain line in FIG. 9.

Note that the contact piece 37 permanently maintains the rising position or the parallel position once the position is determined. As illustrated in FIG. 3, the opening 36 has a resilient contact piece 38 for press-fitting the contact piece 30 to an end of the bottom wall 35.

The press-fit terminals 30*a* for a joint connector are layered with a space therebetween in parallel to the bottom wall 35. The electrical contact piece 32 electrically connects the press-fit terminals 30*a* to one another, since the contact piece 37 of the press-fit terminal 30*a* is inserted into the opening 36 of another upper press-fit terminal 30*a* as illustrated in FIG. 10.

At the same time, the contact piece 37 of the lower press-fit terminal 30*a* is pinched between an end part of the bottom wall 35 and the resilient contact piece 38 of the upper press-fit terminal 30*a*.

Figure 6:
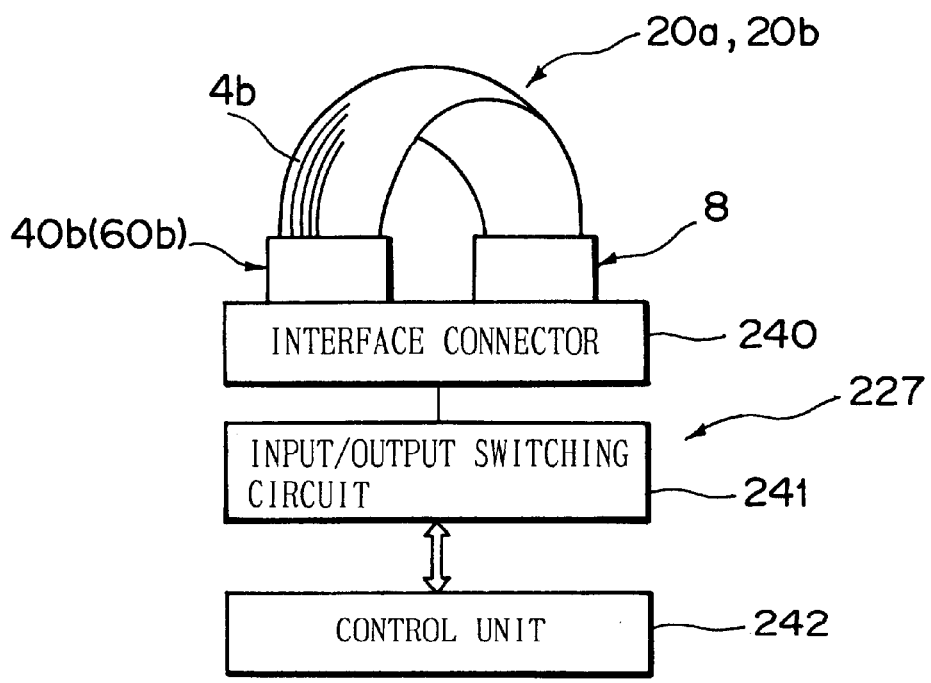
FIG. 6 is a schematic view showing a configuration of a second sub-check station of the sub-harness assembling line illustrated in FIG. 3.

As illustrated in FIG. 6, the press-fit terminal 30*a* is forced into a terminal accommodation chamber 41 of a terminal fitting housing 40*a*. Thereby, the press-fit terminal 30*a* is received in the terminal fitting housing 40*a* to be secured therein.

When received in the terminal accommodation chambers 41, the press-fit terminals 30*a* are disposed in parallel to one another. Adjacent two of the press-fit terminals 30*a* each have a connection piece 39 to electrically connect each other as illustrated in FIG. 11. The connection piece 39 is provided in the side of the electrical cable connection portion 31 of the bottom wall 35.

Since the terminal fitting housings 40*a* and 40*b* have the same configuration as each other, only the terminal fitting housing 40*a* will be representatively discussed. The terminal fitting housing 40*a* is made of an insulating synthetic resin material or the like. As illustrated in FIGS. 12 to 15, the terminal fitting housing 40*a* has a rectangular plate-like main body 42, a plurality of partitions 43 rising from the main body 42, and a plurality of terminal accommodation chambers 41. The partitions 43 are parallel to one another and define the terminal accommodation chambers 41 between them.

Figure 14:
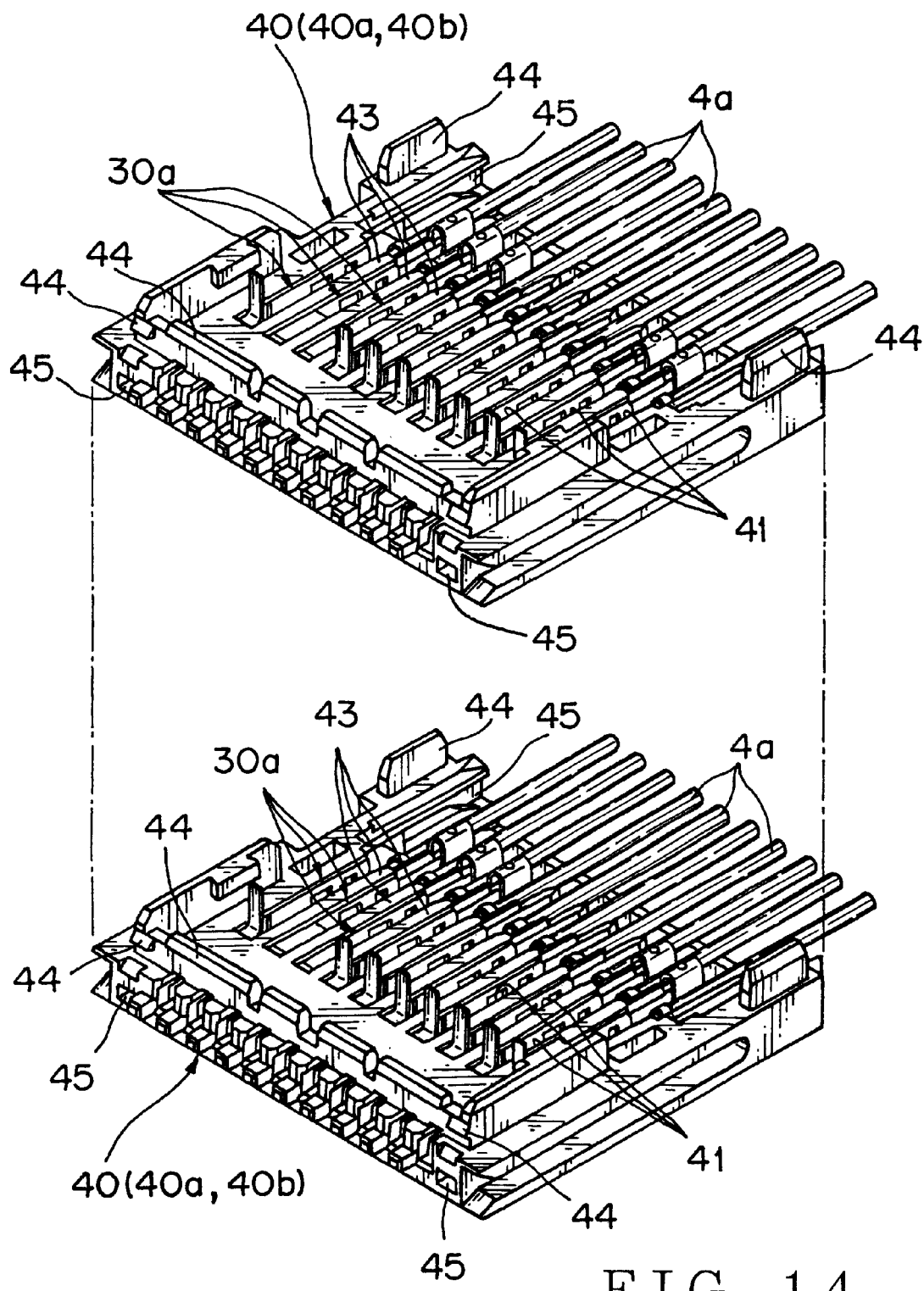
FIG. 14 is a perspective view showing the terminal fitting housings of FIG. 13 layered with a space therebetween.
Figure 15:
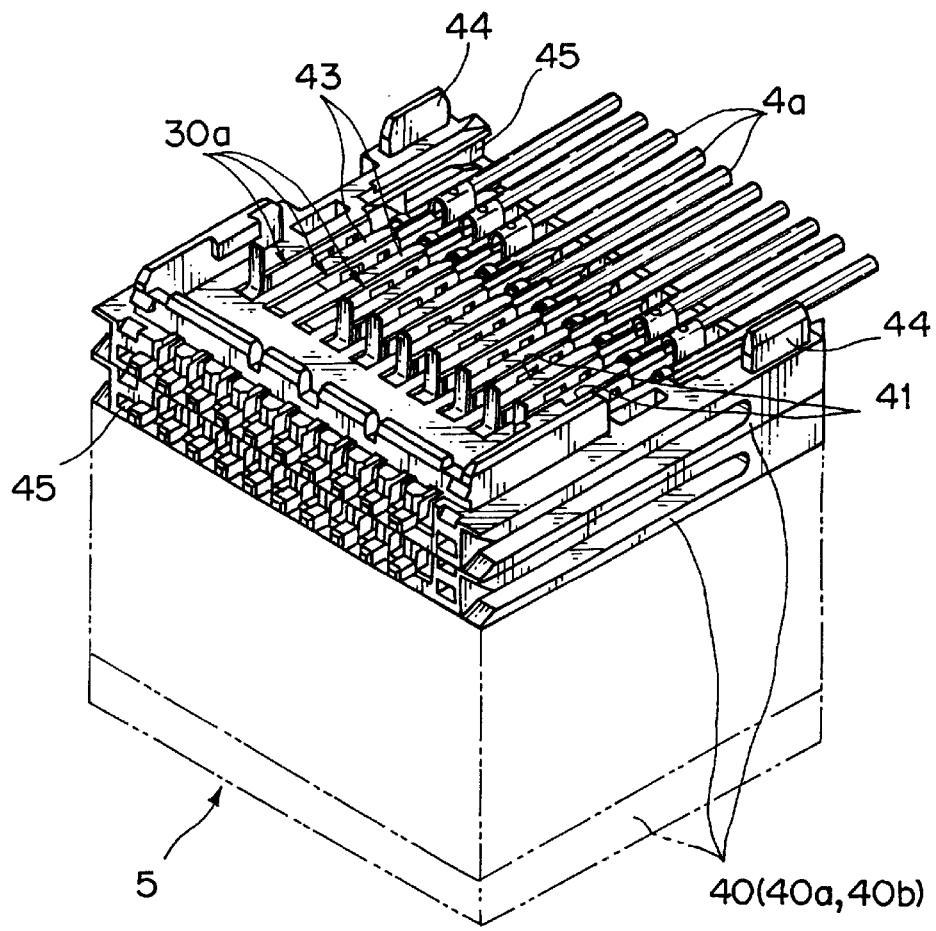
FIG. 15 is a perspective view showing a connector defined by securing the terminal fitting housings of FIG. 13 to one another.

A plurality of the terminal fitting housings 40*a*, each of which has received the press-fit terminals 30*a* in the terminal accommodation chambers 41, are layered with the main bodies being parallel to one another to define the connector 5 as illustrated in FIG. 15. At that time, the electrical cable 4*a* is fitted to each press-fit terminal 30*a* secured in the housing 40*a*. Then, as illustrated in FIG. 14, the terminal fitting housings 40*a* each of which has received the electrical cable 4*a* are layered.

Each terminal fitting housing 40*a* has a plurality of lock projections 44 and locking recesses 45 for securing them to one another when layered as illustrated in FIGS. 12 and 13. Furthermore, the terminal fitting housing 40*a* has a plurality of openings (not shown) each receiving the contact piece 37 of a lower one of press-fit terminals 30*a* so that the contact piece 37 can pass through the opening 36 of an upper one of press-fit terminals 30*a*.

Since the press-fit terminals 50*a* and 50*b* for a junction box have the same configuration as each other, only the press-fit terminal 50*a* will be representatively discussed hereinafter. The press-fit terminal 50*a* is formed from a conductor plate by a bending work. As illustrated in FIG. 16, the press-fit terminal 50*a* has a flat bottom wall 55 on which the electrical cable 4*a* is disposed, an electrical cable connection portion 51, and an electrical contact piece 52.

The electrical contact piece 51 is received in an electrical cable accommodation chamber 61. The electrical cable connection portion 51 has two pairs of opposing crimping pieces 53*a*, and 53*b* and three pairs of opposing press fitting blades 54*a*, 54*b*, and 54*c*. The crimping pieces 53*a*, and 53*b* and the press fitting blades 54*a*, 54*b*, and 54*c* are vertically extending relative to the bottom wall 55.

The crimping pieces 53*a*, and 53*b* are bent to hold the electrical cable 4*a* disposed on the bottom wall 35. The press fitting blades 54*a*, 54*b*, and 54*c* receive the electrical cable 4*a* which is received between each pair of the blades. Thereby, the blades cut into the sheath of the electrical cable 4a to contact the wire core to electrically connect to the electrical cable 4a. That is, the press-fitting of the blades for the electrical cable 4a is completed.

The electrical contact piece 52 has a contact bar 56 along a side edge of the bottom wall 55. The contact bar 56 is a rectangular hollow piece. The electrical contact piece 52 is disposed such that the hollow of the contact bar 56 communicates with a through hole described later of the terminal fitting plate 60a. Through the hollow of the contact bar 56, there is inserted a joint bar 80 illustrated in FIG. 17 for electrical connection thereof. The contact bar 56 has a pair of resilient contact pieces 57 for press-contacting the joint bar 80 thereto.

The joint bar 80 is inserted into the hollows of the contact bars 56 after the terminal fitting plates 60a have been layered. Thus, the electrical contact pieces 52 allow electrical connection of the terminals between the terminal fitting plates 60a to one another.

A press-fit terminal 50a used in a junction-box is forced into one of the electrical cable accommodation chambers 61 of the terminal fitting plate 60a. Thereby, The press-fit terminal 50a is held by the terminal fitting plate 60a. The joint bar 80 is substantially a flat bar made of a conductor metal or the like.

The terminal fitting plates 60a and 60b have the same configuration as each other. Thus, only the terminal fitting plate 60a will be representatively discussed hereinafter. The terminal fitting plate 60a is made of an insulating synthetic resin material or the like. As illustrated in FIGS. 18 to 20, the terminal fitting plate 60a has a rectangular plate-like main body 62, a plurality of partitions 63 rising from the main body 62, a plurality of electrical cable accommodation chambers 61, a plurality of receiving recesses 64, and through openings (not shown).

The partitions 63 are arranged in parallel to one another with a space therebetween. The space between two adjacent partitions 63 defines the electrical cable accommodation chamber 61. The recess 64 receives the contact bar 56 of the press-fit terminals 50a used in the junction-box.

The receiving recess 64 is defined to provide a wider distance between the two adjacent partitions 63. There are provided a plurality of the receiving recesses 64 along a longitudinal direction of the electrical cable accommodation chambers 61. The through hole is provided for each receiving recess 64. The hole passes through the main body 62.

As illustrated in FIGS. 18 and 19, the terminal fitting plate 60a receives the press-fit terminals 50a in the electrical cable accommodation chambers 61 and the receiving recesses 64. Then, the plate-like main bodies 62 are layered in parallel. The joint bars 80 are inserted into the associated through holes and the hollows of the contact bars 56, so that the terminal fitting plates 60a define an electrical distribution block 6 as illustrated in FIG. 20.

At the same time, the press-fit terminals 50a each are connected to the electrical cable 4a. The terminal fitting plate 60a has a plurality of lock projections (not shown) and locking holes 66 engageable with the lock projections. The engagement of the lock projections with the locking holes 66 secures the terminal fitting plates 60a to each other.

The wiring harness 1 is completed by layering the terminal fitting housings 40a or 40b or the terminal fitting plates 60a or 60b, which are consisting of the sub-harnesses 10a, 10b, 10c, 20a, or 20b, to secure them to each other according to a predetermined pattern.

In the terminal fitting housings 40a and 40b which have been layered to be secured to each other, the contact pieces 37 electrically connect the in-joint-connect or disposed press-fit terminals 30a and 30b held by different terminal fitting housings 40a and 40b.

In the terminal fitting plates 60a and 60b which have been layered to be secured to each other, the joint bars 80 electrically connect the in-junction-box disposed press-fit terminals 50a and 50b held by different terminal fitting plates 60a and 60b to each other. The mutual connection of the different press-fit terminals 50a and 50b results in mutual electrical connection of the electrical cables 4a and 4b fitted with the different terminals 50a and 50b.

That is, in the wiring harness 1, a connection portion for electrically connecting the electrical cables 4a and 4b to each other is defined by the layering of the terminal fitting housings 40a and 40b or the terminal fitting plates 60a and 60b and by the connection of the terminals 30a, 30b, 50a, and 50b through the joint bars 80.

Next, referring to FIGS. 1 to 7, a production apparatus and a method thereof of the wiring harness 1 will be discussed. The wiring harness production apparatus has a first sub-harness assembling line illustrated in FIG. 2 and a second sub-harness assembling line illustrated in FIG. 3. The first sub-harness assembling line is an assembling line 201 for press-fitting a terminal to each end of an electrical cable. The second sub-harness assembling line is an assembling line 202 for press-fitting a terminal to one end of an electrical cable and for crimping another terminal to the other end of the electrical cable.

The sub-harness assembling line 201 assembles the sub-harness 10a, 10b, or 10c each having the press-fit terminals at each end thereof. A plurality of the sub-harness assembling lines 201 are provided, and the number of the assembling lines 201 is the same as the different type number of the sub-harnesses 10a, 10b, and 10c used for the wiring harness 1. That is, each sub-harness assembling line 201 assembles one type of the sub-harnesses 10a, 10b, and 10c.

As illustrated in FIG. 2, the sub-harness assembling line 201 has a press-fit terminal inserting station 210, a predetermined-length electrical cable preparing station 211, a press-fitting station 212, and a first sub-check station 213.

The press-fit terminal inserting station 210 forces the press-fit terminals 30a or 50a into the terminal accommodation channels 41 and the electrical cable receiving channels 61 of the housing 40a or into the plate 60a to obtain the sub-harness 10a, 10b, or 10c.

The cable preparing station 211 cuts an electrical cable supplied from an electrical cable supply station (not shown) into cables having a predetermined length. The predetermined-length electrical cables are held by a known retainer bar. The electrical cable supply station has a plurality of reels each for winding one of different types of the electrical cables.

The retainer bar has a plurality of clips for holding the electrical cables. The electrical cable clips align with one another in a direction. Each electrical cable clip has a pair of pieces for pinching the electrical cable 4a therebetween.

The press-fitting station 212 press-fits each end of the electrical cable 4a to the press-fit terminal 30a or 50a received in the housing 40a. or the plate 60a according to a predetermined pattern.

Figure 5:
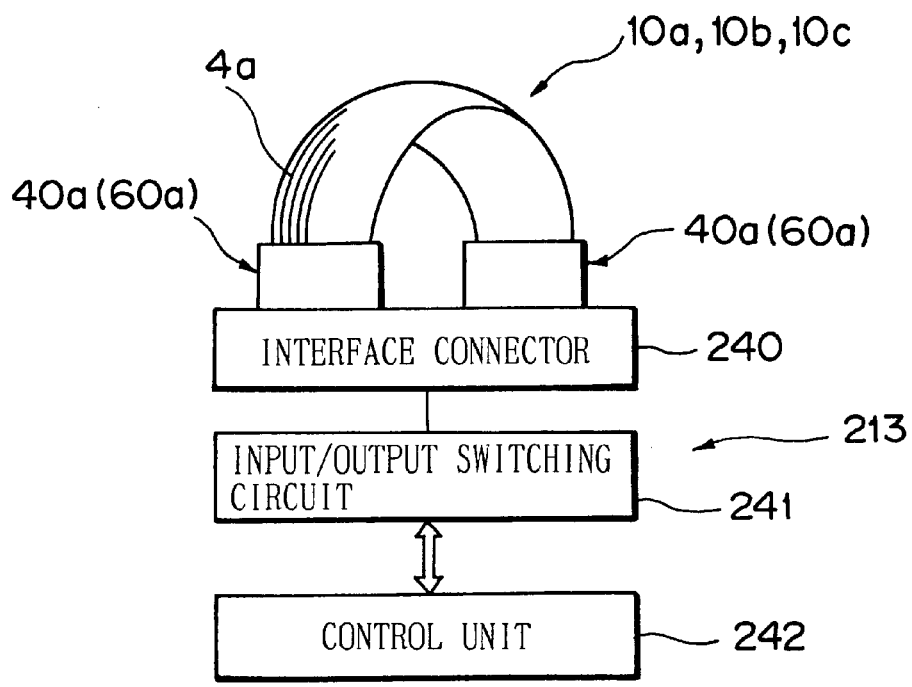
FIG. 5 is a schematic view showing a configuration of a first sub-check station of the sub-harness assembling line illustrated in FIG. 2.

The first sub-check station 213 provides an electrical continuity check for the sub-harnesses 10a, 10b, and 10c which have been obtained through the cable preparing station 211 and the press-fitting station 212. As illustrated in FIG. 5, the first sub-check station 213 has an interface connector 240, an input/output switching circuit 241, a control unit 242, etc.

The interface connector 240 can couple to connectors provided in the housing 40a and the plate 60a. The interface connector 240 has a plurality of connection terminals. The connection terminals connect to the press-fit terminals 30a and 50a, when the interface connector 240 engages with the connectors of the housing 40a and the plate 60a. The connection terminals of the interface connector 240 connect to the input/output switching circuit 241.

The input/output switching circuit 241 applies a voltage to each connection terminal based on a data sequentially provided from a CPU (not shown) of the control unit 242. The input/output switching circuit 241 determines whether the voltage of each connection terminal is higher or lower than a reference voltage. The decisions are sequentially stored in the control unit 242.

The control unit 242 is a calculation unit having a known CPU. The control unit 242 communicates with the input/output switching circuit 241 and the interface connector 240 to control them, which controls the whole first sub-check station 213.

The first sub-check station 213 applies a voltage to one of the press-fit terminals 30a and 50a and determines whether each of the other terminals has a voltage higher or lower than the reference voltage. To each press-fit terminals 30a and 50a, a voltage is sequentially applied to obtain electrical continuity relationships among the press-fit terminals 30a and 50. The first sub-check station 213 determines acceptance or rejection of each sub-harness 10a, 10b, or 10c based on the comparison of an obtained electrical continuity condition with a normal one.

The sub-harness assembling line 202 assembles the sub-harnesses 20a and 20b each having a press-fit terminal at one end and a crimp terminal at the other end. The number of the sub-harness assembling lines 202 is the same as the number of different types of the sub-harnesses 20a and 20b used in wiring harness 1. That is, one of the sub-harness assembling lines 202 corresponds to one type of the sub-harnesses 20a and 20b.

As illustrated in FIG. 3, the sub-harness assembling line 202 has a press-fit terminal inserting station 220, a predetermined-length electrical cable preparing station 221, a press-crimping station 222, a press-fitting station 223, a terminal inserting station 224, and a second sub-check station 227 (see FIG. 6).

The press-fit terminal inserting station 220 press-fits the press-fit terminals 30b or 50b to the terminal accommodation channels 41 and the electrical cable receiving channels 61 of the housing 40b or to the plate 60b used in the sub-harnesses 20a and 20b.

The cable preparing station 221 cuts an electrical cable supplied from an electrical cable supply station (not shown) to obtain a predetermined-length one. The obtained cables are held by the retainer bar. The cable preparing station 221 has a machine 225 for stripping one end of the electrical cable 4b held by the retainer bar.

The electrical cable supply station has a plurality of reels each for winding a different type of electrical cables. Note that a retainer bar used in the sub-harness assembling line 202 has the same configuration as that of the sub-harness assembling line 201. Thus, the retainer bar will not be discussed again.

The press-crimping station 222 has a plurality of crimping machines 226. The crimping machine 226 has a fixed lower molding die and an upper molding die movable relative to the lower die. The crimping machine 226 holds the stripped end of the electrical cable 4b and the crimp terminal 90 between the upper and lower molding dies to crimp the electrical cable 4b and the crimp terminal 90.

The crimping machines 226 align with one another in a direction in which there are disposed the cable preparing station 221, the press-crimping station 222, and the press-fitting station 223, and the terminal inserting station 224. The aligned crimping machines 226 are different from one another in the upper and lower molding dies and in the distance therebetween according the types of the electrical cable 4b and the crimp terminal 90. The press-crimping station 222 crimps the crimp terminal 90 to one end of the electrical cable 4b held by the retainer bar.

The press-fitting station 223 press-fits one of the press-fit terminals 30b and 50b, which is received in the housing 40b or the plate 60b, to the other end of the electrical cable 4b according to a predetermined pattern.

The terminal inserting station 224 inserts the crimp terminal 90 crimped to the electrical cable 4b into the terminal accommodation chamber 101 of the connector housing 100. Thereby, the terminal inserting station 224 fits the connector housing 100 to the other end of the electrical cable 4b.

The second sub-check station 227 makes an electrical continuity check for each sub-harness 20a or 20b obtained through the cable preparing station 221, the press-crimping station 222, the press-fitting station 223, and the terminal inserting station 224.

As illustrated in FIG. 6, the second sub-check station 227 has the same configuration as the first sub-check station 213. Thus, the second sub-check station 227 is provided with the same reference numerals as those of the first sub-check station 213 and will not be discussed again. The second sub-check station 227 determines acceptance or rejection of each terminal 30b, 50b, or 90 by checking electrical continuity relationships with the other terminals 30b, 50b, or 90.

In the embodiment, the sub-harness assembling line 202 has an electrical cable rearranging station 228 as illustrated in FIG. 3. The electrical cable rearranging station 228 is disposed between the press-crimping station 222 and the press-fitting station 223.

The rearranging station 228 rearranges the electrical cables 4b held by the retainer bar so that the stations 223, 224 may carry out smooth press-fit and insertion steps.

Figure 7:
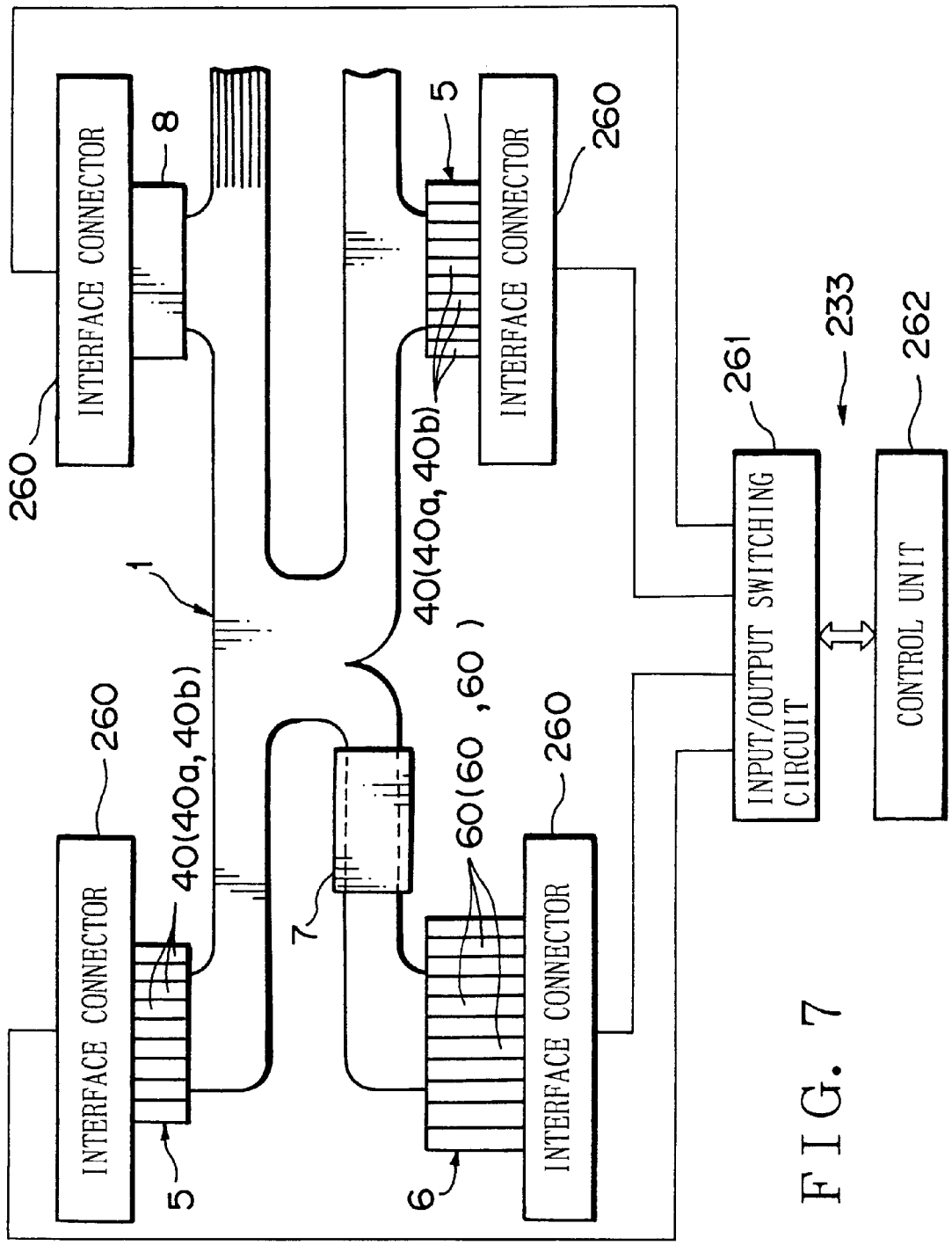
FIG. 7 is a schematic view showing a configuration of a wiring harness check station of a wiring harness assembling line.

The wiring harness assembling line has a plurality of wiring boards 230 (see FIG. 4), a press-fit connector assembling tool, a press-fit-type distribution block assembling tool, and a wiring harness check station 233 (see FIG. 7).

The wiring board 30 is a plate movable along a rail on a floor of a factory. The wiring board 230 may be mounted on an automatically running bogie traveling along a predetermined way. On the wiring board 230, there is pictured a wiring arrangement pattern for arranging the electrical cables 4, the connectors 8, and other additional fittings including the protectors 7. The wiring board 120 has a plurality of clips 235 supporting the sub-harnesses 10a, 10b, 10c, 20a, or 20b according to the wiring arrangement pattern to assemble the wiring harness 1.

As illustrated in FIG. 4, the wiring board 230 also has a plurality of press-fit housing supports 236 and press-fit plate supports 237. The clip 235 bundles together some of the sub-harnesses 10a, 10b, 10c, 20a, and 20b.

The housing support 236 supports the housings 40a and 40b of the sub-harnesses 10a, 10b, and 20a, while the main plate bodies 42 are spaced from each other.

The housing support 237 supports the housings 60a and 60b of the sub-harnesses 10b, 10c, and 20b, while the main plate bodies 62 are spaced from each other.

The connector assembling tool is disposed near the traveling course of the wiring board 230. The connector assembling tool press-fits the housings 40a and 40b held by the housing support 236 to one another so that the lock projections 44 engage with the locking recesses 45. The connector assembling tool assembles the connectors 5.

The distribution block assembling tool is disposed near the traveling course of the wiring board 230. The distribution unit assembling tool press-fits the plates 60a and 60b held by the plate support 237 to each other so that the lock projection may engage with and lock in the locking hole 66. The distribution unit assembling tool inserts the joint bars 80 into the predetermined through holes to contact with the contact bars 56 of the press-fit terminals 50a and 50b for assembling the distribution line unit 6.

The wiring harness check station 233 is disposed near the traveling course of the wiring board 230 at a final end of the assembling line of the wiring harness 1. The wiring harness check station 233 checks electrical continuity of the wiring harness 1 held by the wiring board 230.

As illustrated in FIG. 7, the wiring harness check station 233 has a plurality of interface connectors 260, an input/output switching circuit 261, a control unit 262, etc. The interface connector 260 can engage with the connector 5, the distribution block 6, or the connector 8.

The interface connector 260 has a plurality of connection terminals (not shown). The connection terminals contact the terminals 30a, 30b, 50a, 50b, and 90, when the interface connector 260 engages with the connector 5, the distribution block 6, and the connector 8. The connection terminals of the interface connector 260 connect to the input/output switching circuit 261.

The input/output switching circuit 261 applies a voltage to a sequentially selected one of the connection terminals of the interface connectors 260 which have engaged with the connector 5, the distribution line unit 6, or the connector 8. The input/output switching circuit 261 determines whether each connection terminal related to the selected one has a voltage higher or lower than a reference voltage, and the decisions are sequentially stored in the control unit 262.

The control unit 262 is a calculation unit having a known CPU. The control unit 262 communicates with the input/output switching circuit 261 and the interface connectors 260 to control them, which controls the whole wiring harness check station 233.

The wiring harness check station 233 applies a voltage to a selected one of the press-fit terminals 30a and 30b of the connector 5 and determines whether each of the other terminals has a voltage higher or lower than a reference voltage. To each press-fit terminals 30a and 30b, a voltage is sequentially applied to obtain electrical continuity relationships of the press-fit terminals 30a and 30b. The wiring harness check station 233 determines acceptance or rejection of the connector 5 based on the comparison of an obtained electrical continuity condition with a normal one.

The wiring harness check station 233 also applies a voltage to a selected one of the press-fit terminals 50a and 50b of the distribution line unit 6 and determines whether each of the other terminals has a voltage higher or lower than a reference voltage. To each press-fit terminal 50a and 50b, a voltage is sequentially applied to obtain electrical continuity relationships of the press-fit terminals 50a and 50b. The wiring harness check station 233 determines acceptance or rejection of the distribution line unit 6 based on the comparison of an obtained electrical continuity condition with a normal one.

Thus, the wiring harness check station 233 checks the electrical continuity relationships of the press-fit terminals 30a and 30b of the connector 5 and checks the electrical continuity relationships of the press-fit terminals 50a and 50b of the distribution block 6. That is, the wiring harness check station 233 checks mutual electrical continuity conditions of the terminals 30a, 30b, 50a, and 50b received in the layered housings 40a and 40b or in the layered plates 60a and 60b.

The wiring harness check station 233 checks the electrical continuity among the layered housings 40a and 40b and among the plates 60a and 60b. The wiring harness check station 233 checks the electrical continuity separately for the connector 5 and the distribution block 6.

Figure 1:
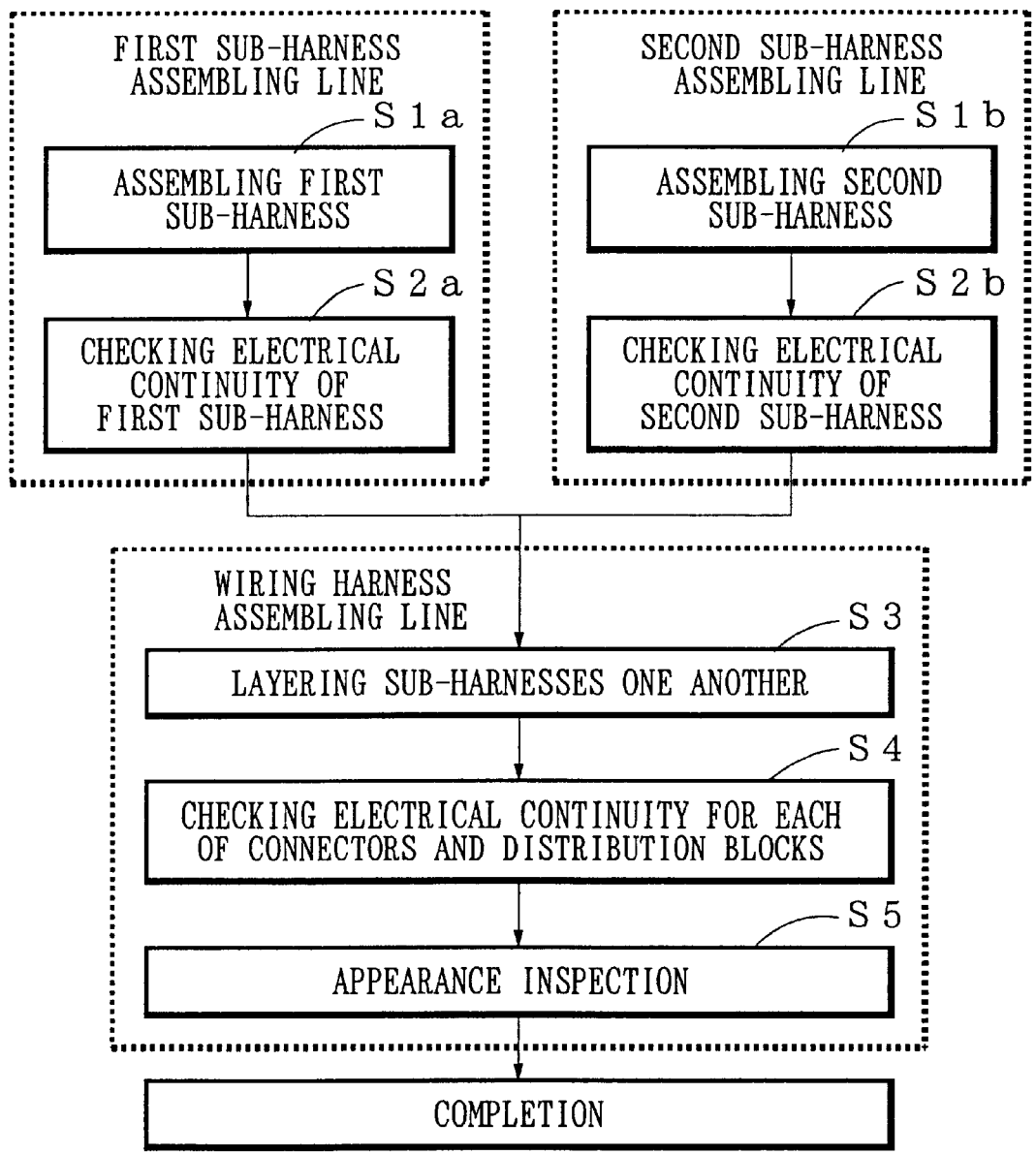
FIG. 1 is a flow chart showing a checking method of a wiring harness embodying the present invention.

Referring to FIG. 1, manufacturing steps for the thus configured wiring harness 1 will be discussed hereinafter.

Step S1a or S1b assembles the sub-harness 10a, 10b, 10c, 20a, or 20b in the sub-harness assembling line 201 or 202.

In a next step S2a, the first sub-check station 213 checks the electrical continuity of the sub-harnesses 10a, 10b, and 10c. In another next step S2b, the second sub-check station 227 checks the electrical continuity of the sub-harnesses 20a and 20b. When steps S2a, S2b are normal, step S3 will be carried out. Note that steps S2a and S2b correspond sequentially to the first and second decision steps described in the summary of the invention.

In the wiring harness assembling line, step S3 layers the housings 40a and 40b or layers the plates 60a and 60b one after another to obtain the connector 5 or the distribution line unit 6. The sub-harnesses 10a, 10b, 10c, 20a, and 20b are thus combined. Furthermore, other fittings including the protectors 7 are furnished at predetermined points before step S4 is carried out.

In step S4, the wiring harness check station 233 checks the electrical continuity condition among the press-fit terminals 30a, 30b, 50a, and 50b for each of the connectors 5 and the distribution line units 6. Note that step S4 corresponds to the third decision step described in the summary of the invention.

Thus, step S4 checks the electrical continuity conditions among the terminals 30a and 30b constituting the connector 5 and also checks the electrical continuity conditions among the terminals 50a and 50b constituting the distribution block 6. When step S4 is normal, step S5 will be carried out. An appearance inspection of Step S5 confirms the completion of the wiring harness 1.

The sub-harnesses 10a, 10b, 10c, 20a, and 20b of the embodiment have the electrical cables 4a and 4b each of which is fitted with the terminal 30a, 30b, 50a, 50b, or 90 at each end thereof.

These terminals 30a, 30b, 50a, 50b, and 90 each are received in one of the housing 40a or 40b, the plate 60a or 60b, and the connector housing 100. The sub-harnesses 10a, 10b, 10c, 20a, and 20b each compose a partial circuit. Thus, an electrical continuity check can be carried out for each sub-harness 10a, 10b, 10c, 20a, or 20b.

According to the checking method related to the wiring harness production apparatus, the first sub-check station 213 checks the sub-harnesses 10a, 10b, and 10c each having press-fit terminals, allowing to surely find incorrectness of a shirt circuit or an open circuit of the sub-harnesses 10a, 10b, and 10c.

Furthermore, the second sub-check station 227 checks the sub-harnesses 20a and 20b each having a press-fit terminal and a crimp terminal, allowing to surely find incorrectness of a shirt circuit or an open circuit of the sub-harnesses 20a and 20b. Such incorrectness can be quickly found to be repaired, improving a productivity of the wiring harness 1.

Moreover, the sub-wiring harnesses 10a, 10b, 10c, 20a, and 20b are checked one after another so that the production of a type of sub-wiring harnesses, in which an incorrectness have been found, is stopped. This prevents an otherwise decreased productivity of the wiring harness 1.

The wiring harness assembling line checks the electrical continuity relationships among the terminals 30a, 30b, 50a, and 50b of the connector 5 and the distribution block 6, allowing a decreased check time of the wiring harness 1. In addition, the wiring harness 1 can be checked when it is on the wiring board 230.

Accordingly, the wiring harness 1 requires no transfer from the wiring harness assembling line to another specified check apparatus, allowing an improved productivity of the wiring harness 1.

In the aforementioned embodiment, for assembling the sub-harnesses 10a, 10b, and 10c, there are provided the cable preparing station 211 and the press-fitting station 212. However, the stations 211 and 212 may be replaced by a random terminal press-fit machine 300 disclosed in Japanese Patent Application Laid-open No. H. 7-296933, which is partially illustrated in FIG. 26. Note that the random terminal press-fit machine 300 may be the press-fit machine described in the summary of the invention.

Figure 26:
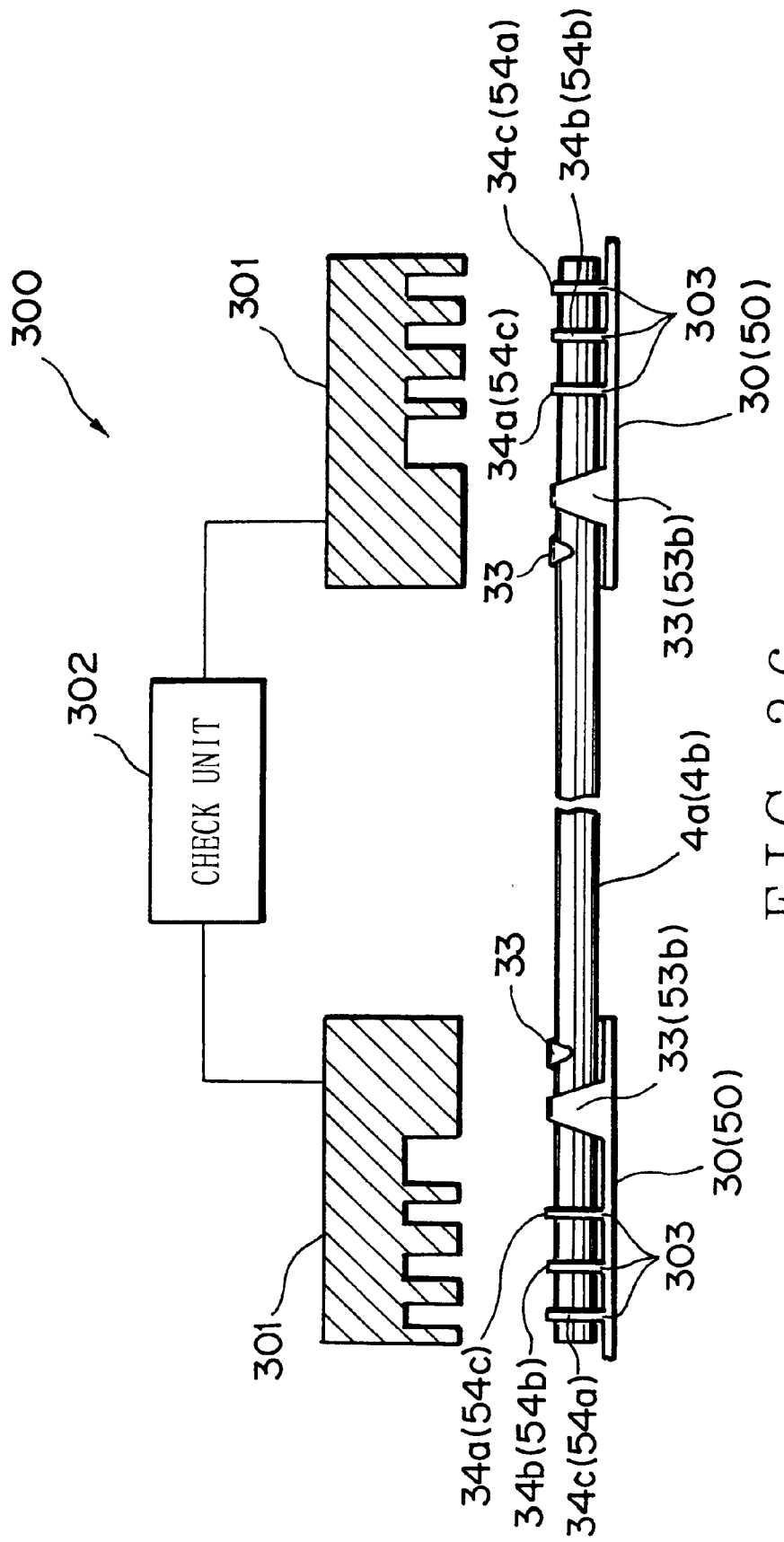
FIG. 26 is a schematic view showing a partial configuration of a random terminal press-fit machine used for assembling the sub-harnesses illustrated in FIGS. 21 to 23.

The random terminal press-fit machine 300 has a plurality of press-fit blades 301 and a check unit 302. In FIG. 26, there are provided a pair of press-fit blades 301. The press-fit blade 301 is made of an electrically conductive metal material. The press-fit blade 301 presses the electrical cable 4a or 4b into a space between a pair of the press-fit pieces 34a, 34b, 34c, 54a, 54b, or 54c and bends the crimping pieces 33 or 53b.

That is, the press-fit blade 301 press-fits the electrical cable 4a or 4b and bends the crimping pieces 33 or 53b to fit the electrical cable 4a or 4b to the press-fit terminal 30 or 50. Note that the press-fit blade 301 contacts the crimping piece 33 or 53b during the crimping. The press-fit blade 301 corresponds to the press-fit means described in the summary of the invention.

The check unit 302 checks the electrical continuity between the press-fit blades 301. During the use of the random terminal press-fit machine 300, the electrical continuity between the press-fit blades 301 is checked while the electrical cable 4a or 4b is fitted with the press-fit terminals 30 or 50. This can check the electrical continuity between the press-fit terminals 30 or 50, that is, for the sub-harnesses 10a, 10b, and 10c.

In the present invention, the sub-harness assembling line 202 may assemble plural types of the sub-harnesses 10a, 10b, and 10c. The wiring board 230 may be mounted on an automatically running bogie traveling along a desirable way on a floor of a factory.

Note that the wiring harness 1 described above may have an electrical cable having a crimp terminal fitted at each end thereof.

What is claimed is:

1. A checking method for determining acceptance or rejection of a wiring harness having a plurality of first sub-harnesses and a plurality of second sub-harnesses, the first sub-harness having a plurality of first electrical cables, a plurality of first press-fit terminals, and a first isolator, the first press-fit terminal being joined to each end of the first electrical cable, the first isolator holding the first press-fit terminals positioned at one end of the first sub-harness, the second sub-harness having a plurality of second electrical cables, a plurality of second press-fit terminals, a plurality of crimp terminals, a connector housing for accommodating the crimp terminals, and a second isolator supporting the second press-fit terminals, the second press-fit terminal being connected to one end of the second electrical cable, the crimp terminal being connected to the other end of the second electrical cable, wherein, when any of the first and second isolators are layered, the press-fit terminals held by different ones of the isolators can be connected to one another, the method comprising the steps of:
assembling the first sub-harness;
assembling the second sub-harness;
conducting a first continuity check of the first sub-harness for determining acceptance or rejection thereof after assembling the completed first sub-harness,
conducting a second continuity check of the second sub-harness for determining acceptance or rejection thereof after assembling of the second sub-harness,
layering the isolators of the first and second sub-harnesses to complete the wiring harness, and
conducting a third continuity check of the layered sub-harnesses for determining acceptance or rejection of the wiring harness after layering the isolators of the first and second sub-harnesses to complete the wiring harness.

2. The checking method set forth in claim 1 wherein the third decision step includes inspecting electrical continuity between the press-fit terminals of the layered isolators.

3. The checking method set forth in claim 2 wherein the first decision step includes inspecting electrical continuity between the press-fit terminals constituting the first sub-harness.

4. The checking method set forth in claim 2 wherein the second decision step inspects electrical continuity between the terminals constituting the second sub-harness.

5. The checking method set forth in claim 1 wherein the first press-fit terminal has a press-fit portion for press-fitting the first electrical cable on the terminal and a crimping piece for crimping the first electrical cable to the terminal, and a press-fitting machine press-fits the first electrical cable to the press-fit portion of the first press-fit terminal and crimps the first electrical cable to the crimping piece, wherein the press-fitting machine has a plurality of press-fitting means with an electrical conductivity, and the first decision step inspects electrical continuity between the press-fit means each contacting the crimping piece when the first electrical cable is press-fitted to the first press-fit terminal.

* * * * *